United States Patent
Jang

(10) Patent No.: US 11,450,711 B2
(45) Date of Patent: Sep. 20, 2022

(54) ELECTRONIC DEVICE AND METHOD OF MANUFACTURING ELECTRONIC DEVICE

(71) Applicant: SK hynix Inc., Icheon (KR)

(72) Inventor: Bong Hoon Jang, Icheon (KR)

(73) Assignee: SK hynix Inc., Icheon (KR)

( * ) Notice: Subject to any disclaimer, the term of this patent is extended or adjusted under 35 U.S.C. 154(b) by 50 days.

(21) Appl. No.: 16/664,510

(22) Filed: Oct. 25, 2019

(65) Prior Publication Data

US 2020/0411593 A1 Dec. 31, 2020

(30) Foreign Application Priority Data

Jun. 26, 2019 (KR) ........................ 10-2019-0076632

(51) Int. Cl.
*H01L 27/24* (2006.01)
*H01L 23/528* (2006.01)
*H01L 45/00* (2006.01)

(52) U.S. Cl.
CPC ........ *H01L 27/2463* (2013.01); *H01L 23/528* (2013.01); *H01L 27/2427* (2013.01); *H01L 45/06* (2013.01); *H01L 45/124* (2013.01); *H01L 45/1233* (2013.01); *H01L 45/1253* (2013.01); *H01L 45/141* (2013.01); *H01L 45/1675* (2013.01); *H01L 45/1683* (2013.01)

(58) Field of Classification Search
CPC ... H01L 45/06; H01L 45/122; H01L 45/1233; H01L 45/124; H01L 45/1253; H01L 45/126; H01L 45/141; H01L 27/2427
See application file for complete search history.

(56) References Cited

U.S. PATENT DOCUMENTS

| | | | |
|---|---|---|---|
| 9,520,555 B2 | 12/2016 | Pellizzer et al. | |
| 9,640,757 B2* | 5/2017 | Zheng | H01L 45/141 |
| 2010/0102306 A1* | 4/2010 | Hsu | G11C 13/0007 257/42 |
| 2011/0155989 A1* | 6/2011 | Park | H01L 45/124 257/3 |
| 2013/0058158 A1 | 3/2013 | Pellizer et al. | |
| 2019/0189688 A1* | 6/2019 | Lille | H01L 45/1616 |
| 2020/0152870 A1* | 5/2020 | Lin | H01L 45/1608 |

FOREIGN PATENT DOCUMENTS

KR 20100082604 A 7/2010

* cited by examiner

*Primary Examiner* — Erik T. K. Peterson

(57) ABSTRACT

An electronic device includes a semiconductor memory. The semiconductor memory may include a plurality of row lines, a plurality of column lines intersecting the row lines, and a plurality of memory cells disposed at respective intersections of the row lines and the column lines. Each memory cell includes a variable resistance pattern having an upper surface which is rounded.

20 Claims, 19 Drawing Sheets

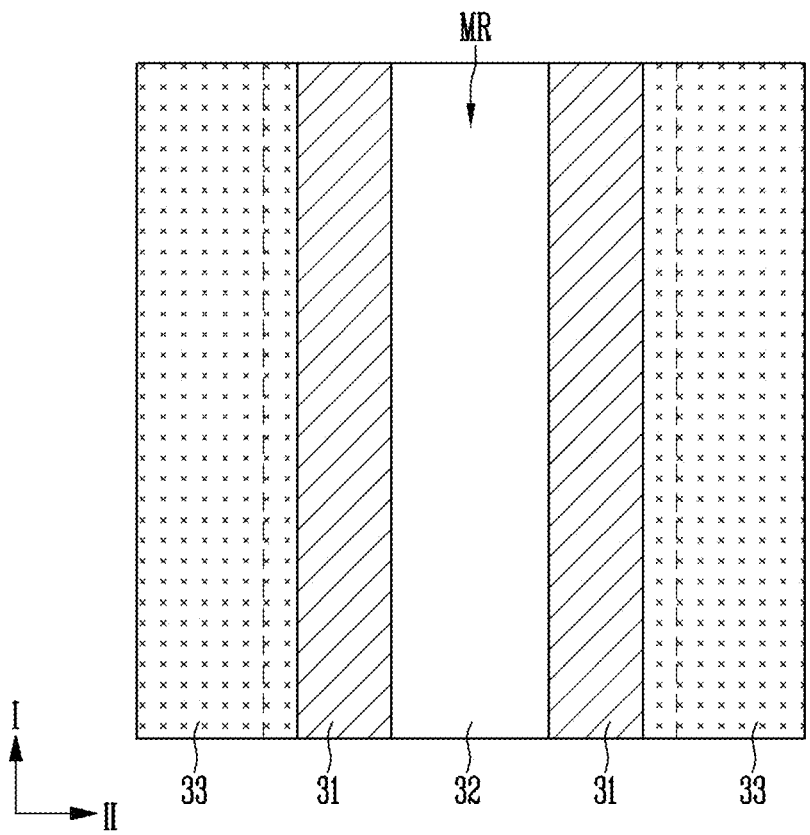
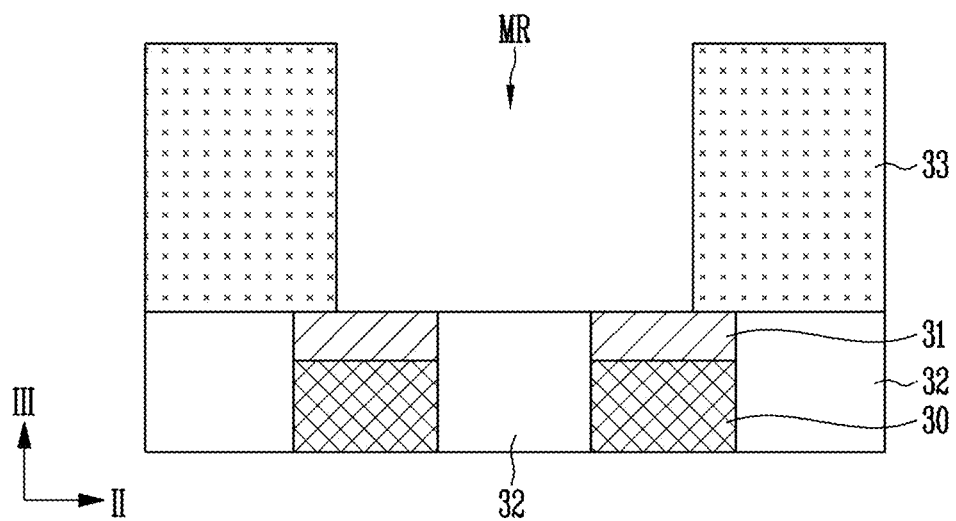

ELECTRONIC DEVICE AND METHOD OF MANUFACTURING ELECTRONIC DEVICE

CROSS-REFERENCE TO RELATED APPLICATION

The present application claims priority under 35 U.S.C. § 119(a) to Korean patent application number 10-2019-0076632, filed on Jun. 26, 2019, which is incorporated herein by reference in its entirety.

BACKGROUND

Field of Invention

The present disclosure relates to an electronic device, and more particularly, to an electronic device and a method of manufacturing the electronic device.

Description of Related Art

In recent years, a semiconductor device capable of storing information in various electronic devices such as a computer and a portable communication device has been developed, according to miniaturization, low power consumption, high performance, and diversification of an electronic device. Therefore, study on a semiconductor device capable of storing data by using a switching characteristic between different resistance states according to an applied voltage or current. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

Embodiments of the present disclosure relate to an electronic device and a method of manufacturing an electronic device capable of improving an operation characteristic and reliability of a memory cell.

An electronic device according to an embodiment of the present disclosure may include a semiconductor memory. The semiconductor memory may include a plurality of row lines, a plurality of column lines intersecting the row lines, and a plurality of memory cells disposed at respective intersections of the row lines and the column lines, each memory cell including a variable resistance pattern having an upper surface which is rounded.

An electronic device according to an embodiment of the present disclosure may include a semiconductor memory. The semiconductor memory may include a plurality of row lines, a plurality of column lines intersecting the row lines, and a plurality of memory cells disposed at respective intersections of the row lines and the column lines, each memory cell including a variable resistance pattern having a cross-section of an L shape, the variable resistance pattern including a chalcogenide and maintaining a phase thereof.

A method of manufacturing an electronic device according to an embodiment of the present disclosure may include forming a plurality of mold patterns each extending in a first direction and defining a mold region, forming a plurality of variable resistance layers each having an upper surface which is rounded, forming an electrode material over the variable resistance layers, forming a plurality of openings that pass through the electrode material to form an electrode layer, forming a plurality of insulating layers in the openings, and forming a plurality of column lines each extending in a second direction over the electrode layer and the insulating layers, the second direction intersecting the first direction.

A method of manufacturing an electronic device according to an embodiment of the present disclosure may include forming mold patterns extending in a first direction and defining a mold region, forming variable resistance layers in the mold region, forming an electrode material on the variable resistance layers, forming openings passing through the electrode material, forming insulating layers in the openings by planarizing the insulating material using the electrode material as a stop layer, and forming column lines extending in a second direction intersecting the first direction on the electrode material and the insulating layers.

According to the electronic device and the method of manufacturing the electronic device according to the embodiments of the present disclosure described above, the operation characteristic and reliability of the memory cell may be improved.

BRIEF DESCRIPTION OF THE DRAWINGS

FIGS. 3A, 4A, 5A, 6A, 7A, 8A, 9A, 10A, 11A, and 12A and FIGS. 3B, 4B, 5B, 6B, 7B, 8B, 9B, 9C, 10B, 11B, and 12B are diagrams illustrating a method of manufacturing an electronic device according to an embodiment of the present disclosure.

DETAILED DESCRIPTION

Figure 1A:
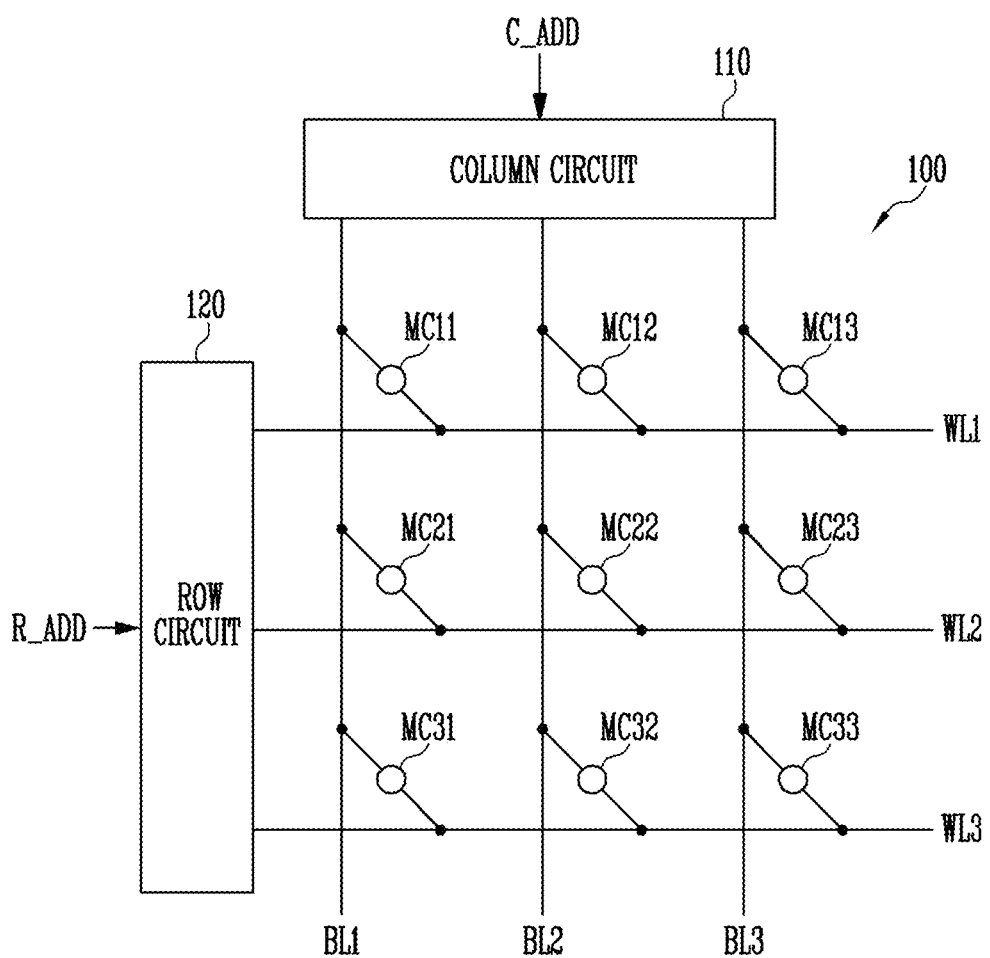
FIGS. 1A and 1B are diagrams illustrating a structure of an electronic device according to an embodiment of the present disclosure.

Hereinafter, various embodiments are described in detail with reference to the accompanying drawings.

The drawings are not necessarily drawn in a fixed ratio, and in some examples, proportions of at least some of the structures shown in the drawings may be exaggerated to clearly show a characteristic of the embodiments. When a multi-layer structure having two or more layers is disclosed in the drawings or the detailed description, a spatial relationship or arrangement order of the layers as shown merely reflect a specific example and embodiments of the present disclosure are not limited thereto. The spatial relationship or arrangement order of the layers may vary. In addition, a drawing or a detailed description of a multi-layer structure may not reflect all layers present in a specific multi-layer structure (for example, there may be more than one additional layer between shown two layers). For example, when a first layer is present on a second layer or a substrate in the multi-layer structure of the drawings or the detailed description, the first layer may be formed directly on the second layer or directly on the substrate, and one or more other layers may be present between the first layer and the second layer or between the first layer and the substrate.

Figure 1B:
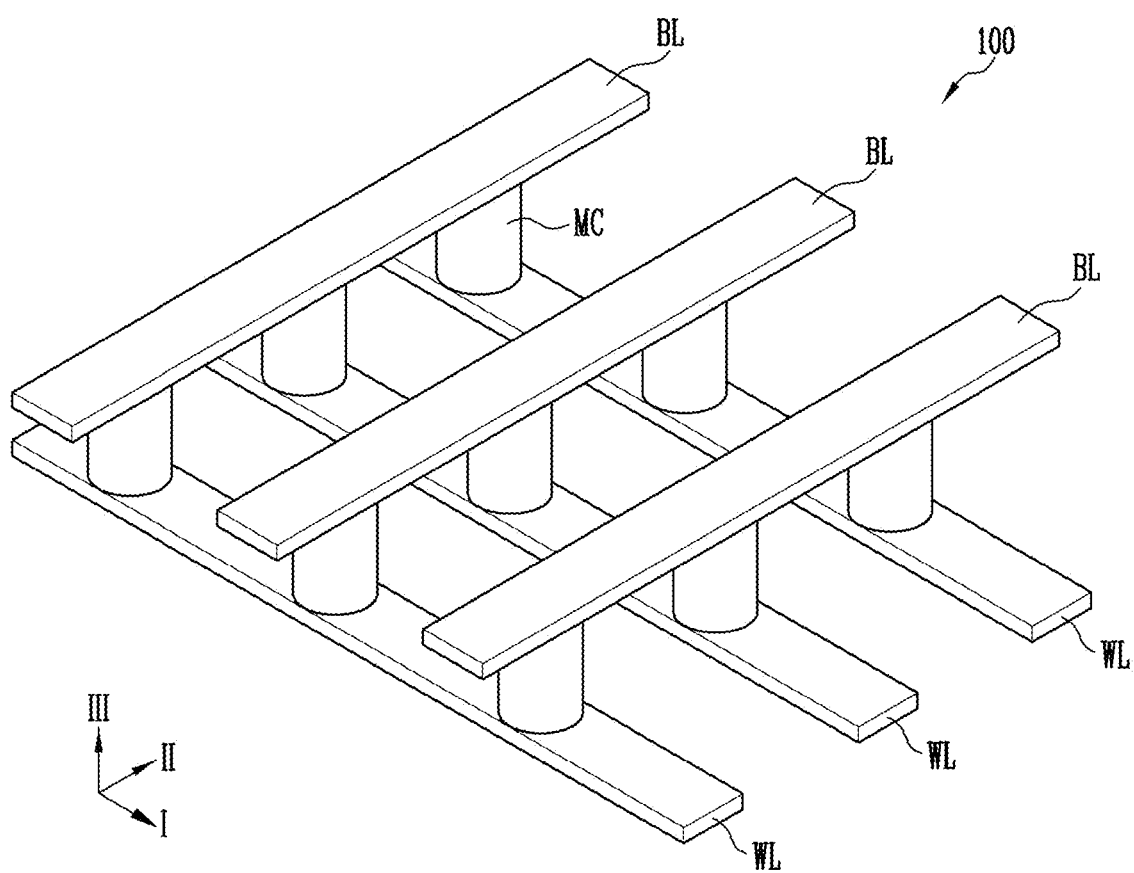

FIGS. 1A and 1B are diagrams illustrating a structure of an electronic device according to an embodiment of the present disclosure. FIG. 1A is a circuit diagram of a cell array 100, and FIG. 1B is a perspective view of the cell array 100.

Referring to FIG. 1A, the electronic device according to an embodiment of the present disclosure may include a semiconductor memory (or a semiconductor device), and the semiconductor memory may be a non-volatile memory device or a variable resistance memory device. The semiconductor memory may include a plurality of row lines and a plurality of column lines intersecting the row lines. Here, the row lines may be word lines, and the column lines may be bit lines. For reference, the word line and bit line are relative concepts, and the row lines may be bit lines and the column lines may be word lines. Hereinafter, it is assumed that the row lines are word lines and the column lines are bit lines.

The cell array 100 may include memory cells MC11 to MC33 disposed between the column lines BL1 to BL3 and the row lines WL1 to WL3, respectively. Here, the memory cells MC11 to MC33 may be disposed at respective points where the column lines BL1 to BL3 and the row lines WL1 to WL3 intersect. Each of the memory cells MC11 to MC33 may include at least one of a selection element and a memory element connected in series.

The memory cells MC11 to MC33 may each include a variable resistance material that reversibly switches between a first resistance state (e.g., a low resistance state) and a second resistance state (e.g., a high resistance state) according to an applied voltage or current. The variable resistance material may include a transition metal oxide, a chalcogen-based compound, a perovskite-based compound, and the like. For example, the variable resistance material may include a chalcogenide material such as Te, Se, Ge, Si, As, Ti, S, and Sb.

A threshold voltage of each of the memory cells MC11 to MC33 is changed according to a resistance state of the variable resistance material therein. Therefore, as the threshold voltage is changed, each of the memory cells MC11 to MC33 may be programmed to have at least two states. For example, when the threshold voltage of each of the memory cells MC11 to MC33 is relatively low, a first logic value (e.g., a logic high value '1') is stored in each of the memory cells MC11 to MC33, and when the threshold voltage of each of the memory cells MC11 to MC33 is relatively high, a second logic value (e.g., a logic low value '0') is stored in each of the memory cells MC11 to MC33. However, even though the threshold voltage of each of the memory cells MC11 to MC33 is changed, the variable resistance material may not change its phase. For example, when the variable resistance material includes chalcogenide, even though the threshold voltage of each of the memory cells MC11 to MC33 is changed, the chalcogenide maintains an amorphous state and is not converted into a crystalline state. Therefore, a plurality of logic states having different threshold voltages may be stored in each of the memory cells MC11 to MC33. In addition, the memory cells MC11 to MC33 may function as a selection element and a memory element at the same time. In other words, the memory cells MC11 to MC33 may not include a separate memory element such as a phase-change memory element or a resistance-change memory element.

In addition, the semiconductor memory may further include a column circuit 110 for controlling the column lines BL1 to BL3 and a row circuit 120 for controlling the row lines WL1 to WL3.

The row circuit 120 may be a row decoder, a word line decoder, a word line driver, or the like. The row circuit 120 selects a single row line (e.g., the second row line WL2) from the row lines WL1 to WL3 according to a row address R_ADD. The column circuit 110 may be a column decoder, a bit line decoder, a bit line driver, or the like. The column circuit 110 selects a single column line (e.g., the second column line BL2) from the column lines BL1 to BL3 according to a column address C_ADD. Therefore, a single memory cell MC22 connected between the selected column line BL2 and the selected row line WL2 may be selected.

For reference, FIG. 1A shows three column lines BL1 to BL3 and three row lines WL1 to WL3, but this is merely for convenience of description, and embodiments of the present disclosure are not limited thereto. The number of the column lines BL1 to BL3 and the row lines WL1 to WL3 included in the cell array 100 may vary according to embodiments.

Referring to FIG. 1B, the memory cell array 100 may include a plurality of column lines BL and a plurality of row lines WL positioned at different levels. The column lines BL may be positioned over the row lines WL or under the row lines WL. The row lines WL may each extend in a first direction I and the column lines BL may each extend in a second direction II intersecting the first direction I. Each of the memory cells MC may be disposed at intersection points of the column lines BL and the row lines WL.

The column lines BL, the memory cells MC, and the row lines WL may form one deck. Although the cell array 100 has a single-deck structure in FIG. 1B, embodiments of the present disclosure are not limited thereto, and one or more decks may be further included. The cell array 100 may have a multi-deck structure in which the row lines WL and the column lines BL are alternately stacked in a third direction III. Here, the third direction III is a direction intersecting the first direction I and the second direction II, and may be a direction perpendicular to a plane defined by the first direction I and the second direction II. In the multi-deck structure, stacked decks may share the row lines WL or the column lines BL.

Figure 2A:
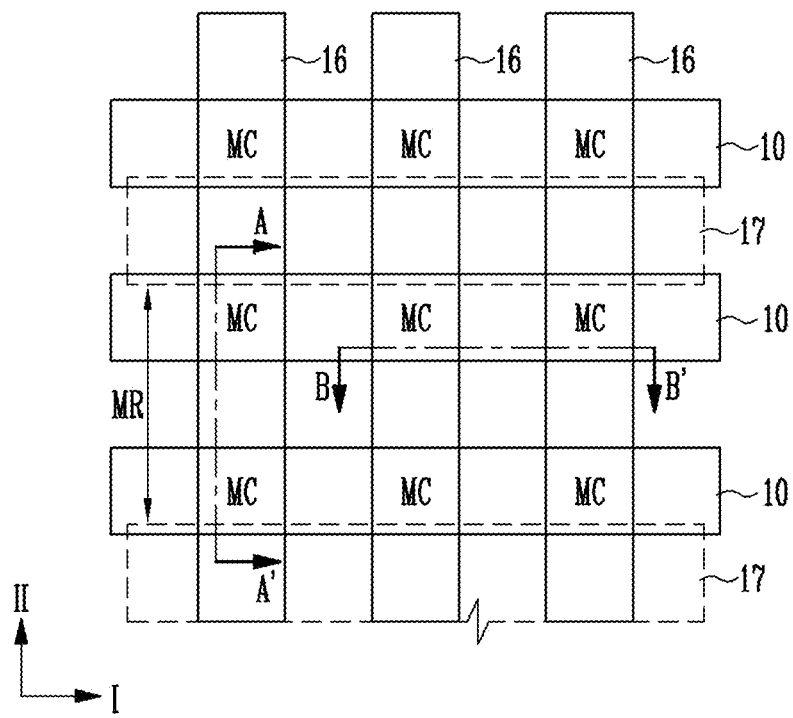
FIGS. 2A, 2B, and 2C are diagrams illustrating a structure of an electronic device according to an embodiment of the present disclosure.
Figure 2B:
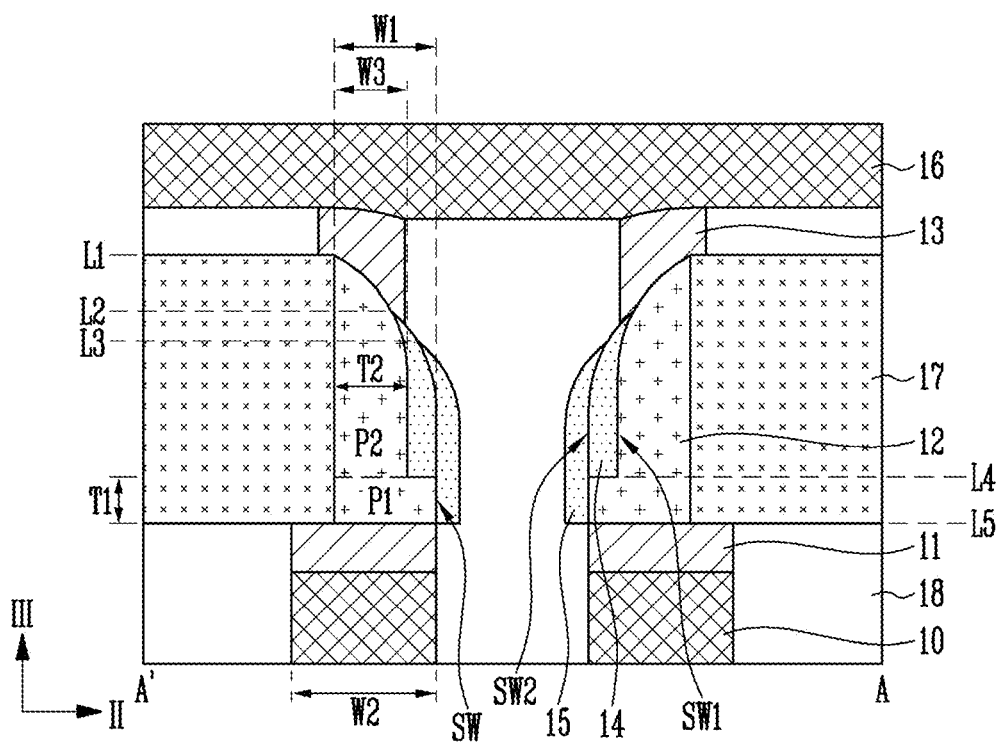
Figure 2C:
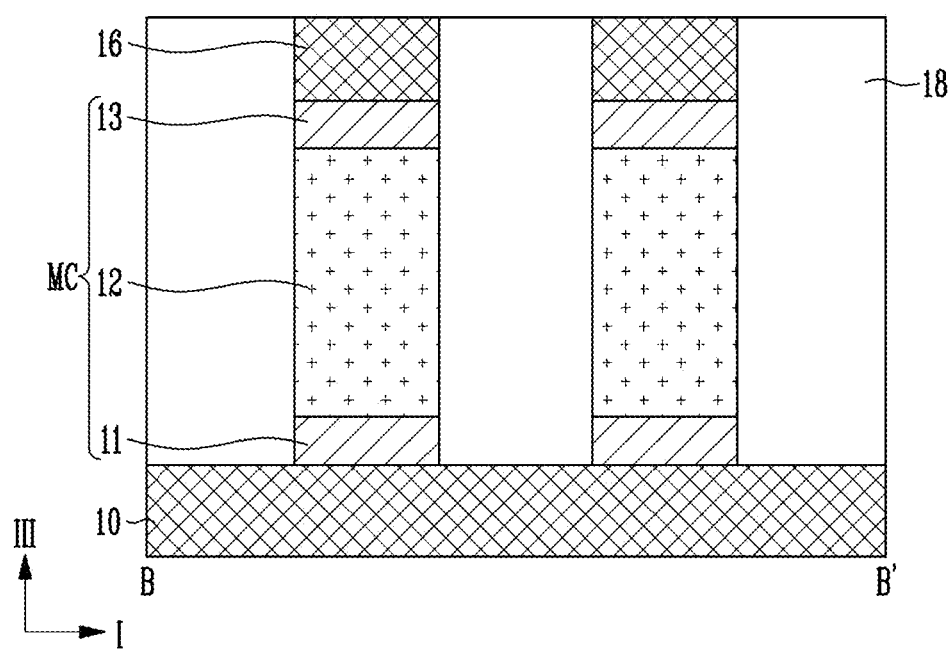

FIGS. 2A, 2B, and 2C are diagrams illustrating a structure of an electronic device according to an embodiment of the present disclosure. FIG. 2A is a layout, FIG. 2B is a cross-sectional view along a first line A-A' of FIG. 2A, and FIG. 2C is a cross-sectional view along a second line B-B' of FIG. 2A.

Referring to FIGS. 2A to 2C, the electronic device according to an embodiment of the present disclosure may include row lines 10, column lines 16, and memory cells MC. In addition, the electronic device may further include a first insulating spacer 14, a second insulating spacer 15, a mold pattern 17, and an insulating layer 18.

The column lines 16 may be positioned over the row lines 10 and the mold patterns 17 may be positioned between the row lines 10 and the column lines 16. The mold patterns 17 may each extend in the first direction I and a mold region MR may be defined as a space between a pair of mold patterns 17 adjacent in the second direction II. The mold region MR may be positioned to correspond to a pair of row lines 10 adjacent in the second direction II.

The memory cells MC may be positioned in the respective intersection regions of the row lines 10 and the column lines 16. Each of the memory cells MC may include a first electrode 11, a variable resistance pattern 12, and a second electrode 13.

The variable resistance patterns 12 may be formed in the mold region MR and each of the variable resistance patterns 12 is formed on a sidewall of a corresponding one of the mold patterns 17. A pair of variable resistance patterns 12 facing each other in the second direction II may have a symmetrical structure of a mirror type.

Each of the variable resistance patterns 12 may have an L shape when seen in the cross-sectional view of FIG. 2B. Each of the variable resistance patterns 12 may include a first portion P1 formed along an upper surface of the first electrode 11, and a second portion P2 protruding from the first portion P1 and connected to the second electrode 13. In an embodiment, the second portion P2 may have substantially the same thickness T2 in the second direction II as that T1 in the third direction III of the first portion P1. In another embodiment, the second portion P2 may have the thickness T2 thicker than that T1 of the first portion P1. The first portion P1 may be in contact with a portion of the upper surface of the first electrode 11. For example, in the cross-sectional view of FIG. 2B, the first portion P1 may have a width W1 in the second direction II narrower than that W2 of the first electrode 11 in the second direction II. In addition, in the cross-sectional view of FIG. 2B, the first portion P1 may have the width W1 in the second direction II wider than that W3 of the second portion P2 in the second direction II.

Each of the variable resistance patterns 12 may have a rounded upper surface. Specifically, referring to FIG. 2B, the second portion P2 of each of the variable resistance patterns 12 may have a vertical lower portion and a curved upper portion. The vertical lower portion may be disposed between the first portion P1 and the curved upper portion. The curved upper portion may include a plurality of sub-portions, each of which includes a circular arc approximating a corresponding profile of the curved upper portion at a specific point. A curvature is defined as an inverse of a radius of each of the sub-portions. In an embodiment, each of the plurality of sub-portions of the curved upper portion has substantially the same curvature, and thus the second portion P2 has a curved upper portion having a single finite curvature and a vertical lower portion having a zero curvature (i.e., an infinite radius). In another embodiment, the plurality of sub-portions of the curved upper portion have different curvatures, and thus the second portion P2 has a curved upper portion having a plurality of curvatures and a vertical lower portion having a zero curvature (i.e., an infinite radius). For example, the plurality of curvatures of the curved upper portion may decrease from an upper portion to a lower portion of the curved portion. A top of each of the variable resistance patterns 12 may have a level L1 substantially equal to that of an upper surface of the mold patterns 17.

The first electrode 11 may be electrically connected to the row line 10 and may be interposed between the variable resistance pattern 12 and the row line 10. In the second direction II, the first electrode 11 may have a width W2 substantially equal to that of the row line 10.

The second electrode 13 may be electrically connected to the column line 16 and may be interposed between the variable resistance pattern 12 and the column line 16. The second electrode 13 may have a rounded upper surface. In addition, the second electrode 13 may be in contact with the rounded upper surface of the variable resistance pattern 12. The second electrode 13 may further be in contact with at least one of the mold pattern 17, the first insulating spacer 14, and the second insulating spacer 15.

The first electrode 11 and the second electrode 13 may include a conductive material such as carbon, metal, or metal nitride. Each of the first electrode 11 and the second electrode 13 may include any one of tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), and the like, and may include a combination thereof. For example, the first electrode 11 and the second electrode 13 may be carbon electrodes.

The first insulating spacers 14 and the second insulating spacers 15 protect the variable resistance patterns 12 in a manufacturing process. The first insulating spacers 14 and the second insulating spacers 15 may include an insulating material such as an oxide, a nitride, and the like. For example, the first insulating spacers 14 and the second insulating spacers 15 may include silicon oxide ($SiO_x$), silicon nitride ($Si_3N_4$), ultra-low-temperature oxide (ULTO) material, or the like, or may include a combination thereof. In addition, each of the first insulating spacers 14 and the second insulating spacers 15 may be a single layer or a multi-layer layer.

The first insulating spacers 14 and the second insulating spacers 15 may be formed to cover sidewalls of the memory cells MC that face each other in the second direction II. The first insulating spacer 14 may be formed on the variable resistance pattern 12 and may be in direct contact with the variable resistance pattern 12. Each of the first insulating spacer 14 and the second insulating spacer 15 may have a rounded upper surface. The variable resistance pattern 12 may include a first curved upper portion, the first insulating spacer 14 may include a second curved upper portion, and the second insulating spacer 15 may include a third curved upper portion. A level L2 of a top of the first insulating spacer 14 may be positioned lower than the level L1 of the top of the variable resistance pattern 12.

The first insulating spacer 14 may include a first sidewall SW1 and a second sidewall SW2 facing the first sidewall SW1. The first sidewall SW1 may be in contact with the variable resistance pattern 12. The second sidewall SW2 may be substantially aligned with the sidewall SW of the first portion P1 of the variable resistance pattern 12. That is, the second sidewall SW2 and the sidewall SW may be positioned substantially in the same plane. In addition, the second sidewall SW2 may be substantially aligned or may be positioned substantially in the same plane with the sidewall of the row line 10, or the sidewall of the first electrode 11, or both.

The second insulating spacer 15 may be formed on the first insulating spacer 14 and may be in direct contact with the first insulating spacer 14. The second insulating spacer 15 may be in direct contact with a portion (e.g., the first portion P1) of the variable resistance pattern 12. The second insulating spacer 15 may protrude from the sidewall of the row line 10, or the sidewall of the first electrode 11, or both. The second insulating spacers 15 may have a rounded upper surface. A level L3 of a top the second insulating spacers 15 may be positioned lower than the level L2 of the top of the first insulating spacers 14. In addition, a lower surface of the second insulating spacer 15 may be positioned at a level L5 lower than that L4 of a lower surface of the first insulating spacer 14. The lower surface of the second insulating spacer 15 may be a coplanar with a lower surface of the variable resistance pattern 12.

The insulating layer 18 may be positioned between neighboring row lines 10, between neighboring memory cells MC, and between neighboring column lines 16. The insulating layer 18 may be a single layer or a multi-layer layer. In addition, the insulating layer 18 may include an air gap. The insulating layer 18 may include an oxide such as silicon oxide ($SiO_2$), may include a liquidity oxide layer such as spin on coating (SOC) or spin on dielectric (SOD), or may include a combination thereof.

According to the structure as described above, a degree of integration of the memory element may be improved by arranging the memory cells MC in a cross-point array structure. In addition, a size of each memory cell MC may be reduced and uniformity of the memory cells MC may be improved by forming the variable resistance patterns 12 having a cross-section in the L shape. For example, each of the variable resistance patterns 12 may be formed by conformally depositing a variable resistance material and a first insulating material and then by etching back the deposited variable resistance material and first insulating material, similarly to a spacer patterning technology (SPT) process. As a result, a width of the first portion P1 of the variable resistance patterns 12 in the second direction II may be smaller than a width of a variable resistance element in a conventional memory cell. Moreover, because an exposed area to form each of the variable resistance patterns 12 during an etching process is smaller than that of a variable resistance element in each of a plurality of conventional memory cells, characteristics (e.g., a threshold voltage) of each of the memory cells MC according to an embodiment of the present disclosure may be more uniform than those of the conventional memory cells.

FIGS. 3A to 12A and FIGS. 3B to 12B are diagrams for illustrating a method of manufacturing an electronic device according to an embodiment of the present disclosure. FIGS. 3A to 12A and 9C are plan views of such an electronic device, FIGS. 3B to 11B are cross-sectional views obtained by cutting the electronic device of FIGS. 3A to 11A with a plane defined by a second direction II and a third direction III, respectively, and FIG. 12B is a cross-sectional view obtained by cutting the electronic device of FIG. 12A with a plane defined by a first direction I and the third direction III.

Figure 3A:
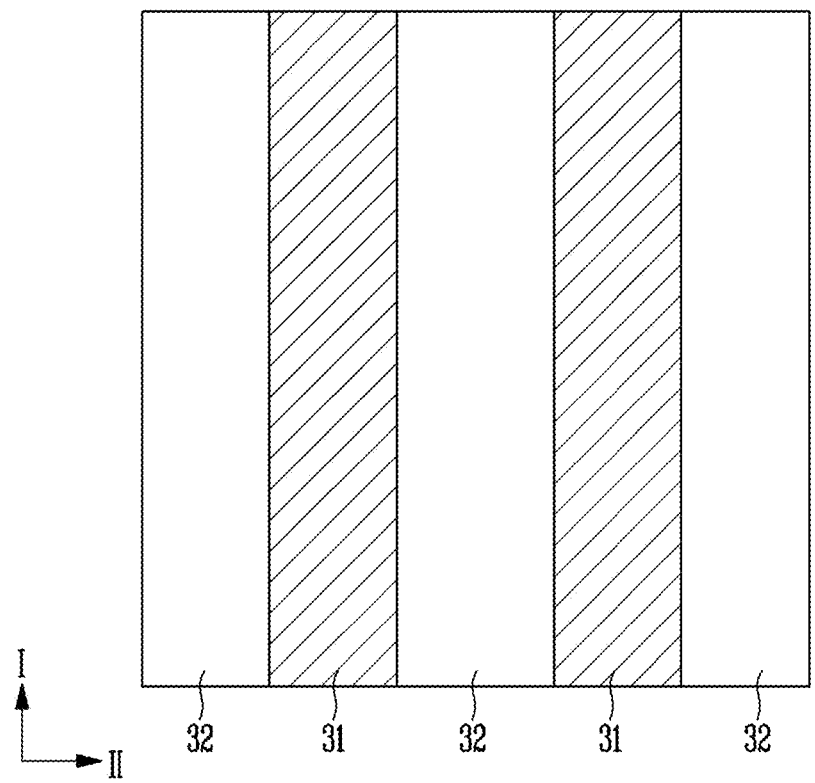
Figure 3B:
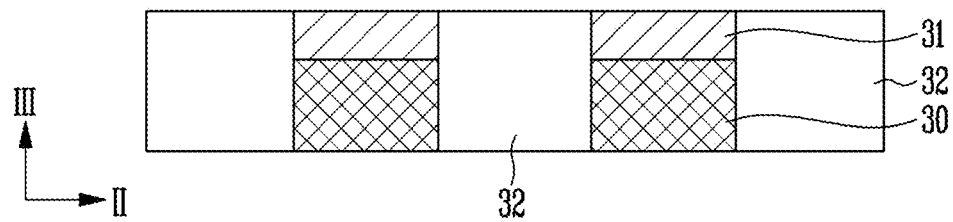

Referring to FIGS. 3A and 3B, row lines 30 and first electrode layers 31 each extending in the first direction I are formed. For example, after a conductive layer and an electrode material for the row lines are formed, the conductive layer and the electrode material are patterned to form the row lines 30 and the first electrode layers 31, respectively.

Subsequently, each of first insulating layers 32 are formed between the row lines 30 adjacent to each other in the second direction II. For example, each of the first insulating layers 32 may be formed between the first electrode layers 31 neighboring in the second direction II and between the row lines 30 neighboring in the second direction II.

Referring to FIGS. 4A and 4B, mold patterns 33 each extending in the first direction I are formed. A mold region MR is defined between adjacent mold patterns 33. The mold region MR exposes a pair of first electrode layers 31 or a pair of row lines 30 neighboring in the second direction II. The mold patterns 33 may include nitride.

The mold patterns 33 may be formed so as to cover some of the first insulating layers 32. For example, the mold patterns 33 may cover odd-numbered first insulating layers 32 and expose even-numbered first insulating layers 32, or cover even-numbered first insulating layers 32 and expose odd-numbered first insulating layers 32, among the first insulating layers 32 arranged in order along the second direction II. In addition, the mold patterns 33 may each cover a portion of a corresponding one of the first electrode layers 31. For example, the mold pattern 33 may cover the first insulating layer 32 and the mold pattern 33 may cover a portion of one of the first electrode layers 31 that are disposed on both sides of the first insulating layer 32.

Figure 5A:
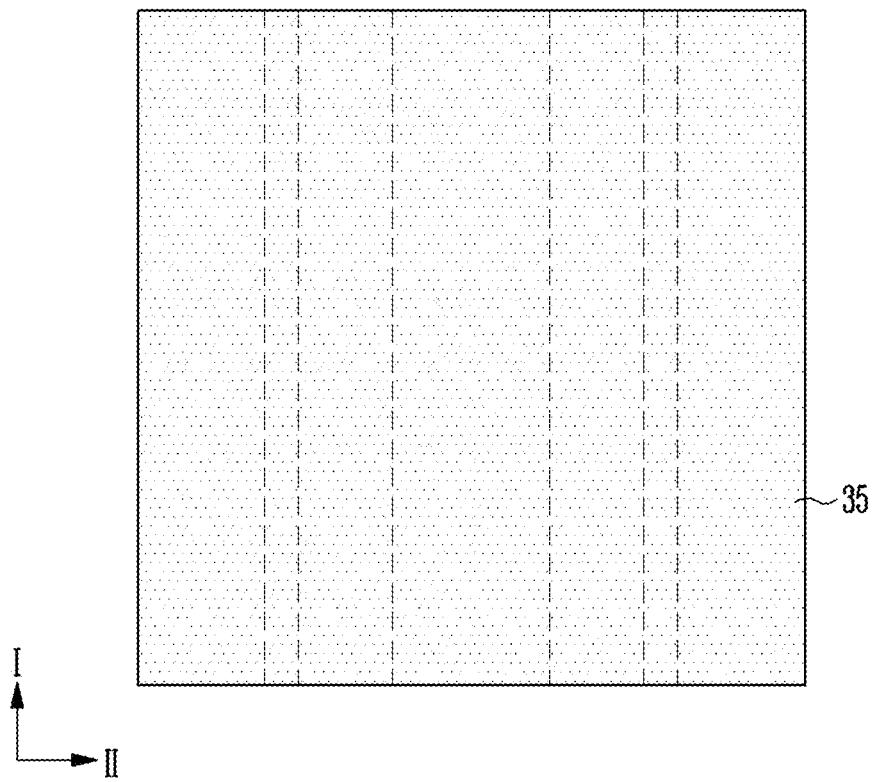
Figure 5B:
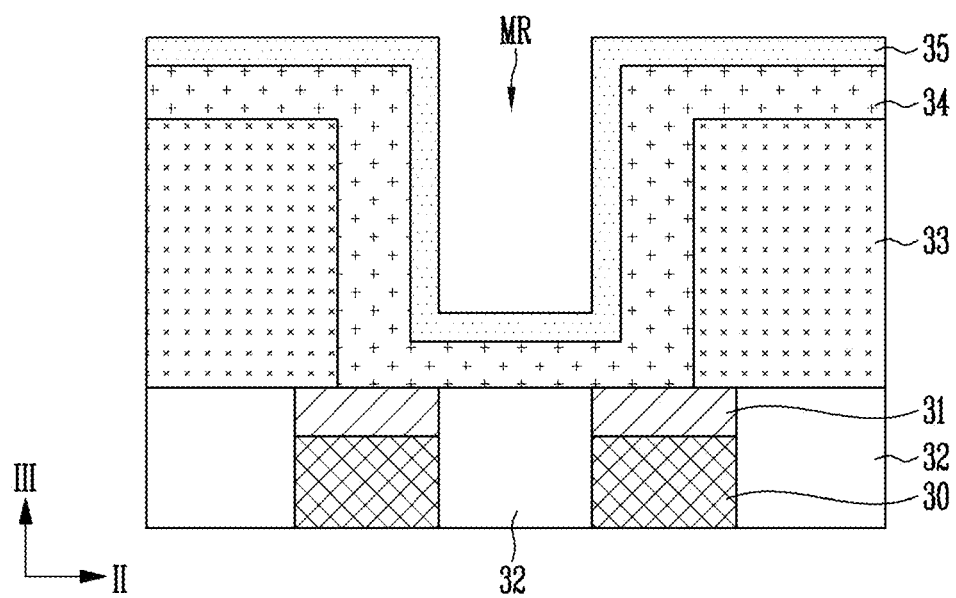

Referring to FIGS. 5A and 5B, a variable resistance material 34 is formed on the mold patterns 33. The variable resistance material 34 may be conformally formed along a profile of the mold patterns 33. The variable resistance material 34 may be formed in the mold region MR and may be formed along an upper surface of the first insulating layer 32, an upper surface of the first electrode layer 31, and sidewalls of the mold patterns 33. In addition, the variable resistance material 34 may also be formed on upper surfaces of the mold patterns 33.

The variable resistance material 34 may be formed to have a substantially uniform thickness, or may be formed to have different thicknesses in a direction perpendicular to a bottom surface thereof. The variable resistance material 34 may be formed using a deposition process. For example, according to a deposition condition, the variable resistance material 34 may be formed thicker on the sidewalls of the mold patterns 33 than on a lower surface of the mold region MR, and may be formed thicker on the side walls of the mold patterns 33 than the upper surface of the mold patterns 33.

Subsequently, a first insulating material 35 is formed on the variable resistance material 34. The first insulating material 35 may be conformally formed along a profile of the variable resistance material 34. The variable resistance material 34 may include nitride.

Figure 6A:
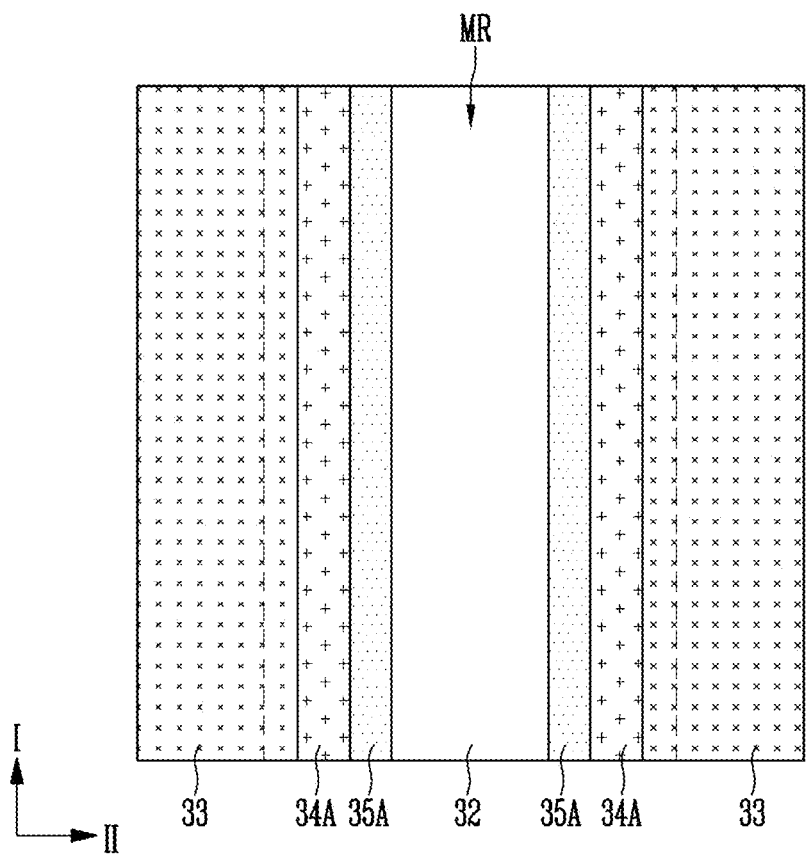
Figure 6B:
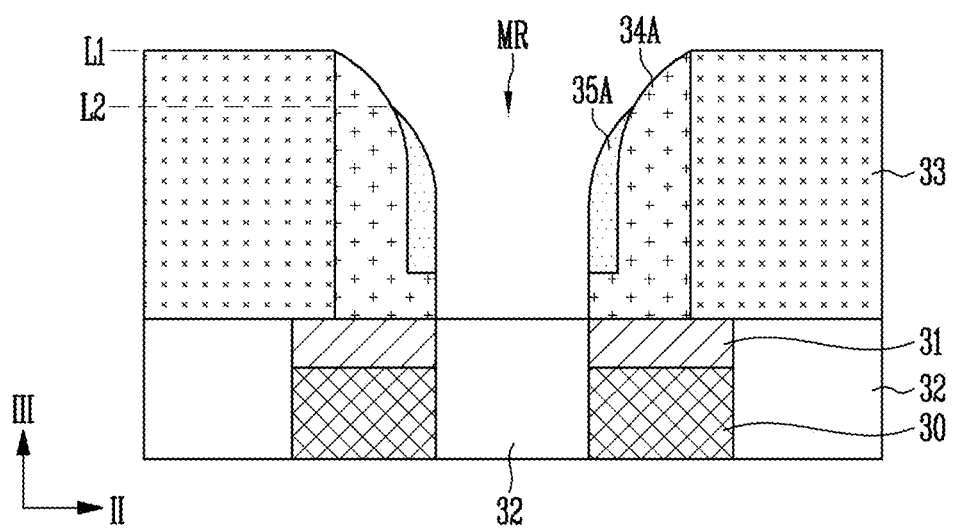

Referring to FIGS. 6A and 6B, the first insulating material 35 and the variable resistance material 34 are etched to form a first insulating spacer 35A and a variable resistance layer 34A. Since the first insulating material 35 serves as a protective layer when the variable resistance material 34 is etched, damage to the variable resistance material 34 may be reduced compared to a variable resistance element in a conventional memory cell. The first insulating layer 32 may be exposed between a pair of first insulating spacers 35A neighboring in the second direction II.

The first insulating material 35 and the variable resistance material 34 may be etched using a blanket etch process. A portion of the first insulating material 35 and the variable resistance material 34 formed on a lower surface of the mold region MR and on the upper surface of the mold pattern 33 is removed by the etching process. When the variable resistance material 34 has a relatively thin thickness on the lower surface of the mold region MR and on the upper surface of the mold pattern 33, the corresponding region may be easily removed. Therefore, the first insulating spacer 35A having a spacer shape and the variable resistance layer 34A may be formed.

Each of the variable resistance layers 34A are formed on the sidewall of each of the mold patterns 33 and may have an L-shape seen in the cross-sectional view of FIG. 6B. For example, the variable resistance layers 34A may include a first portion (e.g., a first portion P1A in FIG. 7B) that is in contact with the first electrode layer 31 and a second portion (e,g. a second portion P2A in FIG. 7B) protruding from an upper surface of the first portion.

Each of the variable resistance layers 34A may have a rounded upper surface. One or more curvatures of a curved upper portion of each of the variable resistance layers 34A may be controlled using a variation in thickness of the variable resistance material 34 of FIG. 5B, or a degree of anisotropy of the etching process, or both. A top of each of the variable resistance layers 34A may be positioned at substantially the same level L1 as the upper surface of the mold patterns 33, or may be positioned at a level lower than that of the upper surface of the mold patterns 33.

The first insulating spacers 35A are formed on the variable resistance layers 34A. The first insulating spacers 35A may have a rounded upper surface. A level L2 of a top of the first insulating spacers 35A may be positioned lower than the level L1 of the top of the variable resistance layers 34A.

Figure 7A:
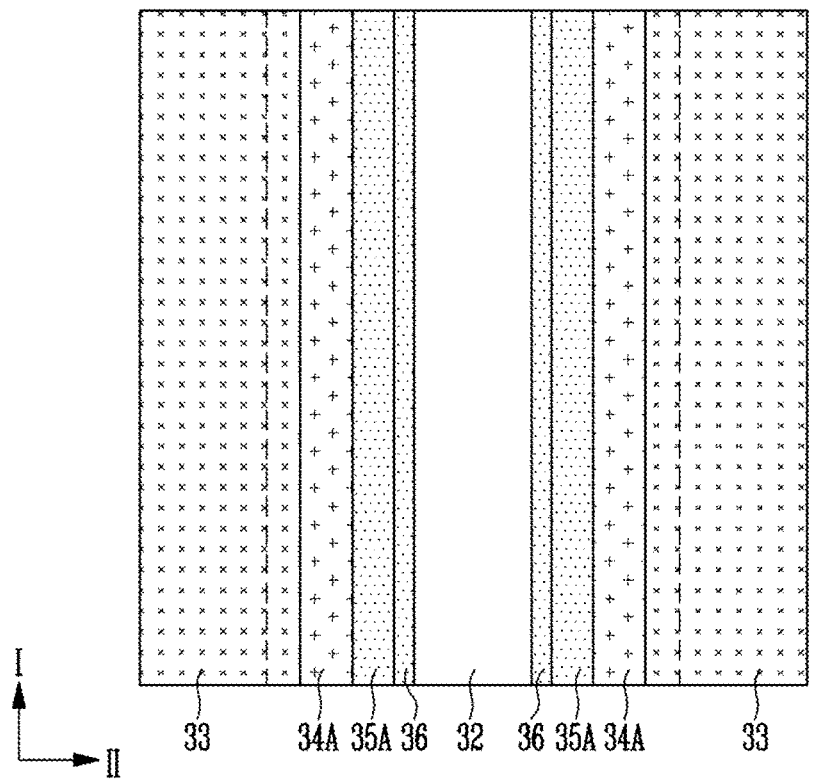
Figure 7B:
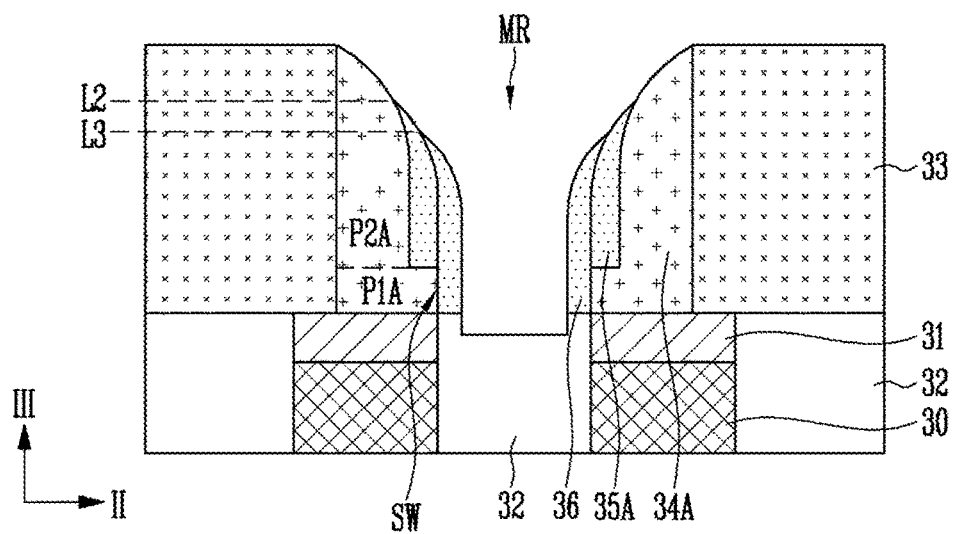

Referring to FIGS. 7A and 7B, second insulation spacers 36 are formed on the sidewall of the mold patterns 33. For example, after conformally forming a second insulating material, the second insulating spacers 36 are formed by etching the second insulating material using a blanket etch process. In the process of etching the second insulating material, the first insulating layer 32 may be partially etched in thickness.

The second insulating spacers 36 may be in contact with the first insulating spacers 35A. The second insulating spacers 36 may be in contact with the variable resistance layers 34A. The second insulating spacers 36 may cover a sidewall SW of the first portion P1A of the variable resistance layers 34A. Therefore, the variable resistance layers 34A may be protected in a subsequent process.

The second insulating spacers 36 may have a rounded upper surface. A top of the second insulating spacers 36 may be positioned at a level L3 lower than the level L2 of the top of the first insulating spacers 35A.

Figure 8A:
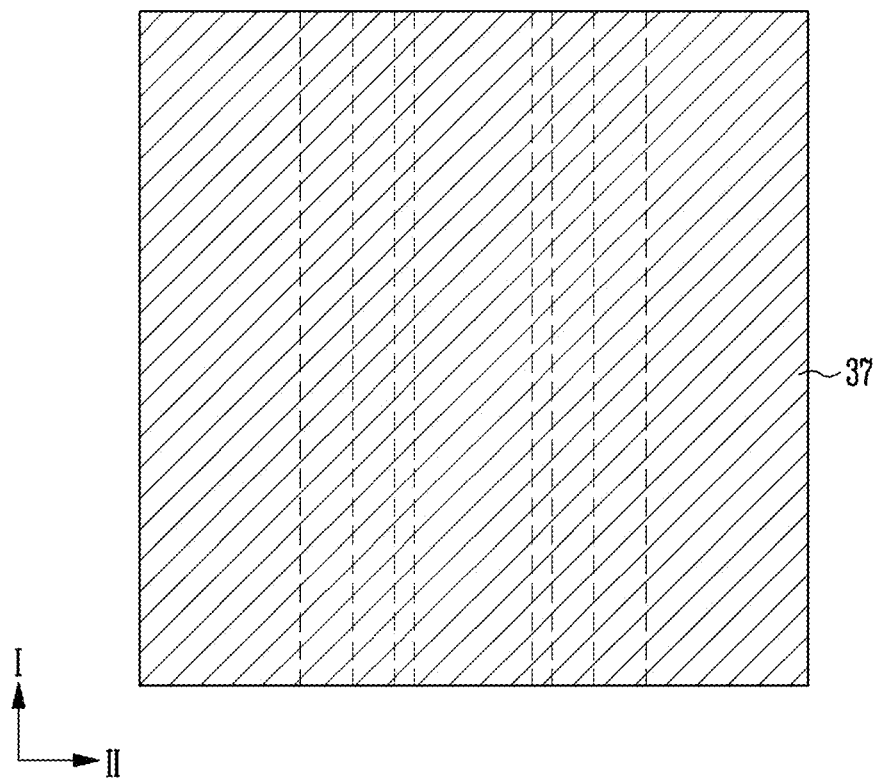
Figure 8B:
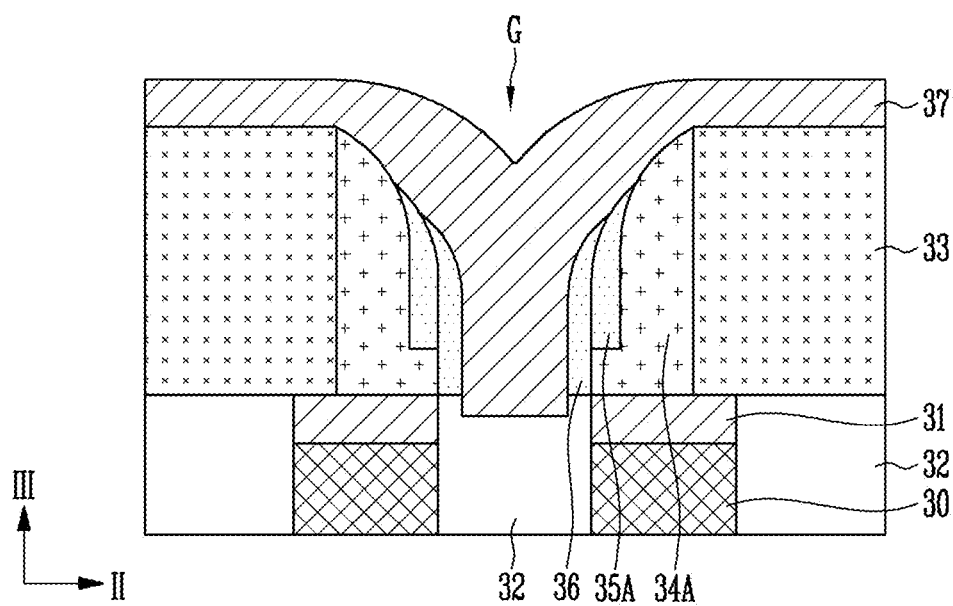

Referring to FIGS. 8A and 8B, an electrode material 37 is formed. The electrode material 37 is formed to fill the mold region MR. In addition, the electrode material 37 is formed on the second insulating spacers 36, the first insulating spacers 35A, the variable resistance layers 34A, and the mold patterns 33. An upper surface of the electrode material 37 may include a groove G positioned at a position corresponding to the mold region MR.

Figure 9A:
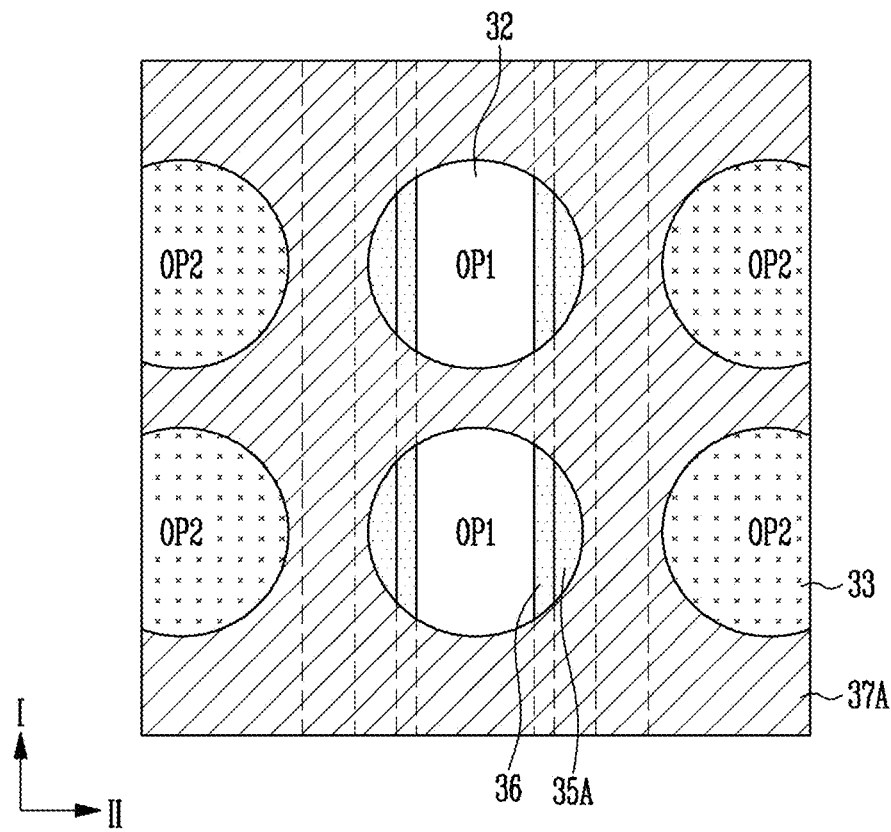
Figure 9B:
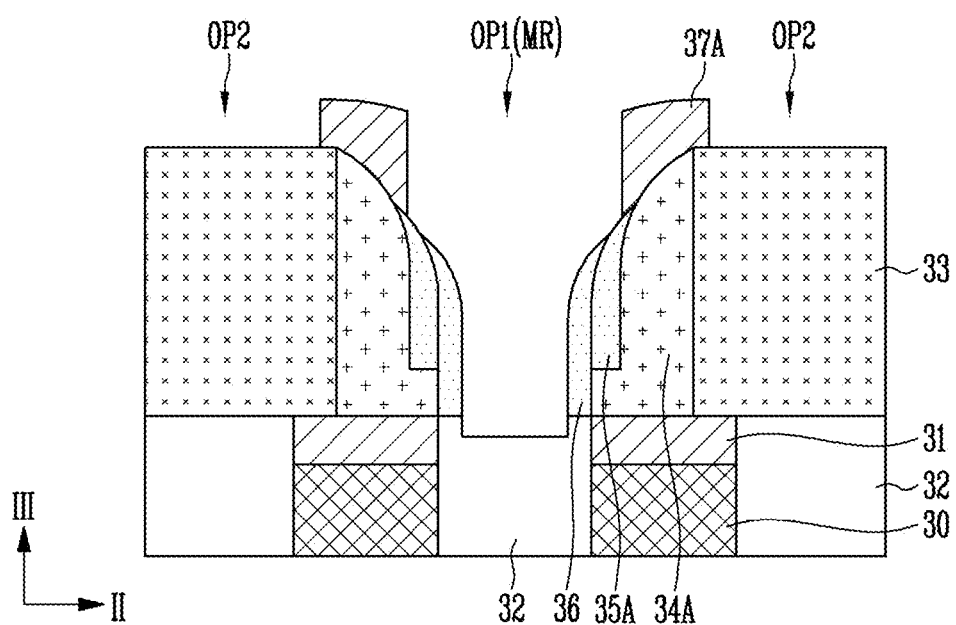
Figure 9C:
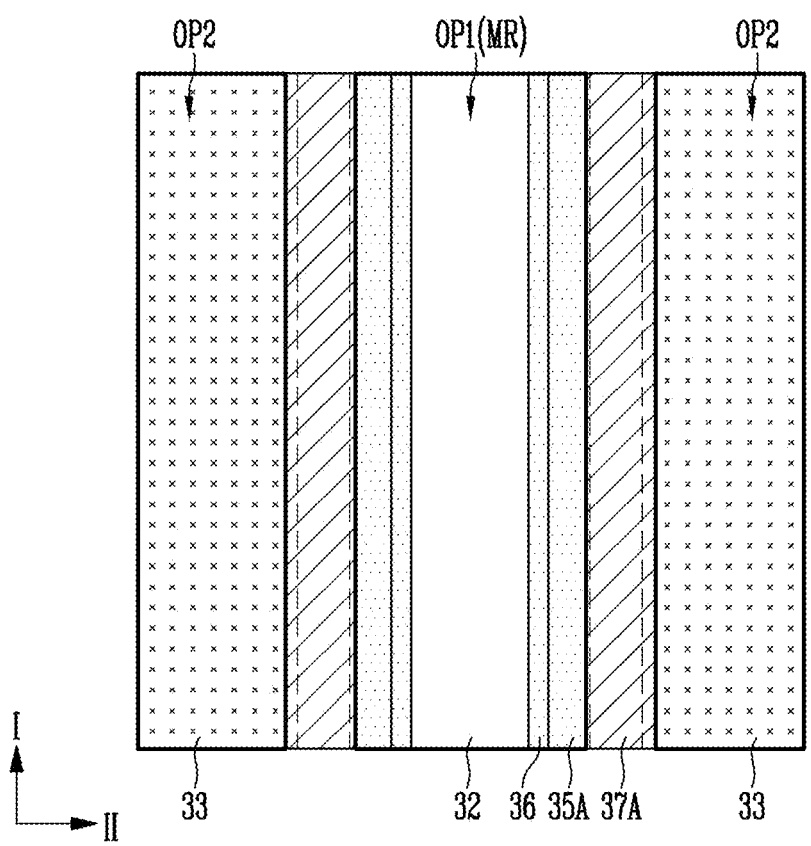

Referring to FIGS. 9A to 9C, openings OP1 and OP2 penetrating the electrode material 37 are formed. After a mask pattern (not shown) is formed on the electrode material 37, the electrode material 37 may be etched using the mask pattern as an etching barrier. At this time, the etching process may be performed under a condition that an etching ratio (or an etch rate selectivity) of the electrode material 37 over the first insulating spacers 35A, the second insulating spacers 36, and the mold patterns 33 is relatively high. For example, when the electrode material 37 includes carbon, the electrode material 37 is selectively etched using an $O_2$ etchant. Therefore, the first insulating spacers 35A, the second insulating spacers 36, and the mold patterns 33 may not be substantially etched whereas the electrode material 37 may be selectively etched. As a result, a second electrode layer 37A including the openings OP1 and OP2 is formed.

The openings OP1 and OP2 may be formed in various shapes. Referring to FIG. 9A, the openings OP1 and OP2 may each have an island shape and may be arranged in the first direction I and the second direction II. For example, the openings OP1 and OP2 may have a shape of a circle, an ellipse, or a polygon. However, embodiments of the present disclosure are not limited thereto. For example, referring to FIG. 9C, the openings OP1 and OP2 may each have a line shape extending in the first direction I. In other embodiments, some of the openings OP1 and OP2 each having the island shape and some of the openings OP1 and OP2 each having the line shape may be formed.

Each of the first openings OP1 may be positioned in the mold region MR and may expose the first insulating layer 32. In addition, the first insulating spacers 35A, or the second insulating spacers 36, or both may be exposed through the first openings OP1. However, the variable resistance layers 34A may not be exposed during the etching process to form the openings OP1 and OP2, thereby substantially preventing an occurrence of damage to the variable resistance layers 34A during the etching process. The second openings OP2 may expose the mold patterns 33.

Figure 10A:
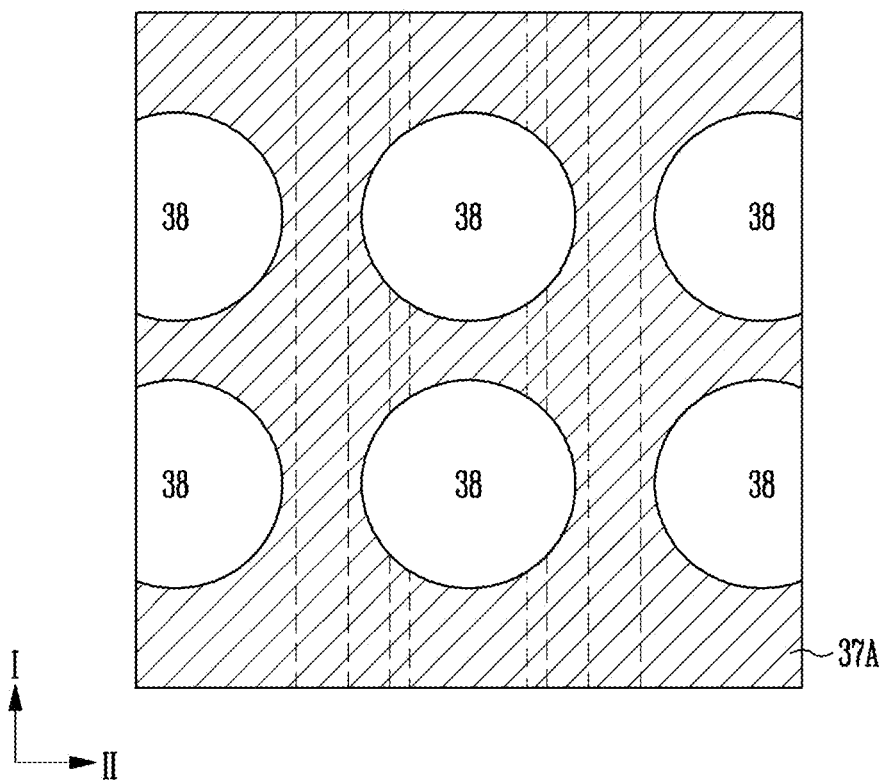
Figure 10B:
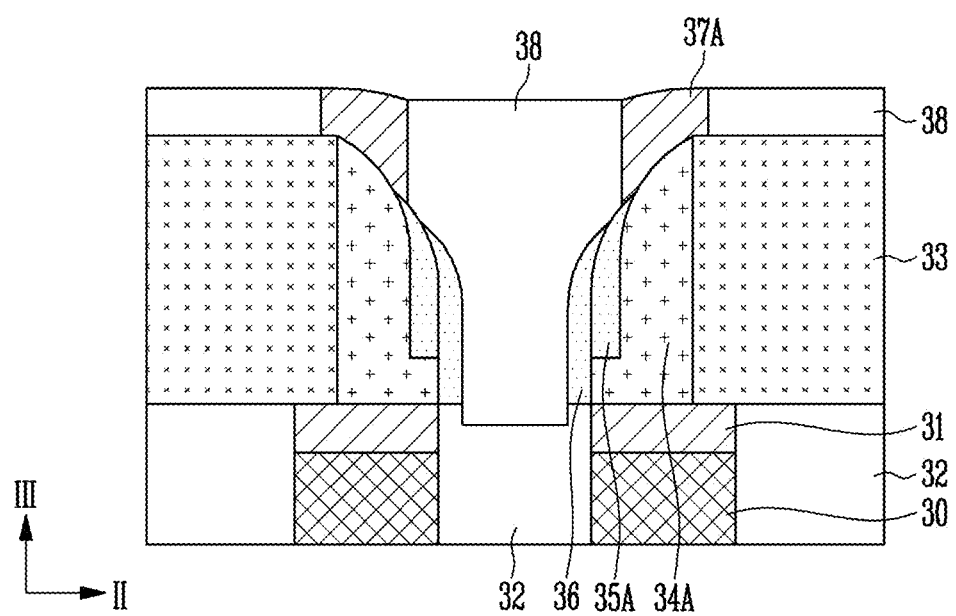

Referring to FIGS. 10A and 10B, second insulating layers 38 are formed in the openings OP1 and OP2. For example, after forming an insulating material to fill the openings OP1 and OP2, the insulating material is planarized. For example, the insulating material is polished using a chemical mechanical polishing (CMP) process. At this time, the insulating material may be planarized using the second electrode layer 37A as a stop layer. Therefore, the variable resistance layers 34A are not exposed in the planarization process.

Figure 11A:
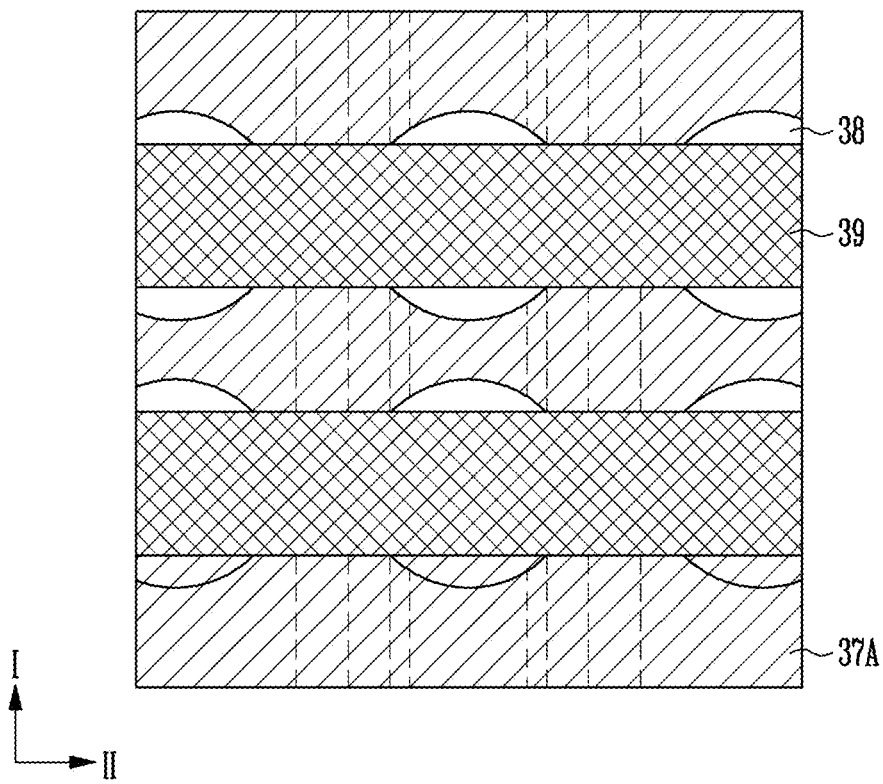
Figure 11B:
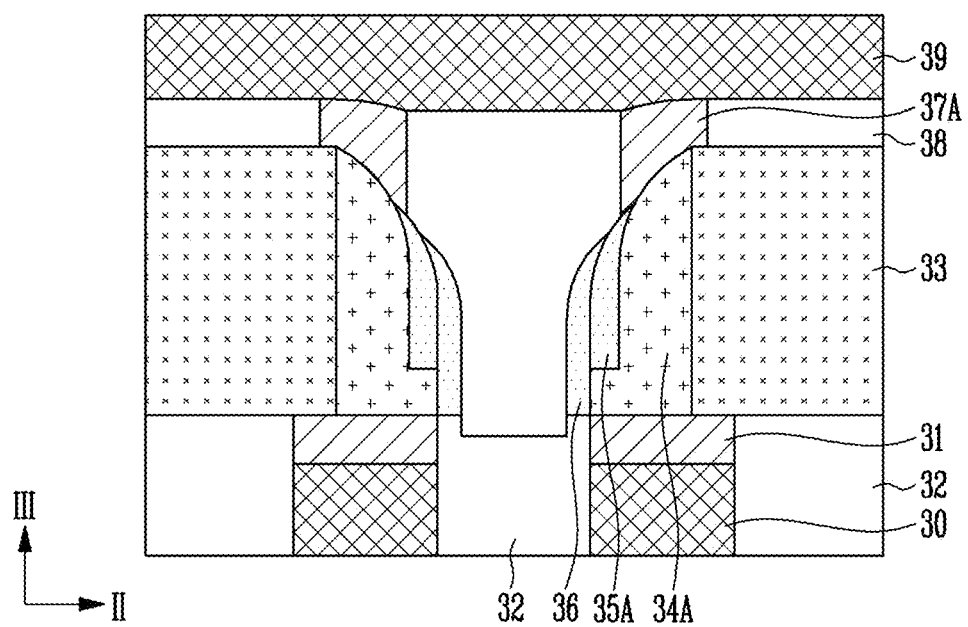

Referring to FIGS. 11A and 11B, column lines 39 are formed on the second electrode layer 37A and the second insulating layers 38. The column lines 39 may each extend in the second direction II. For example, a conductive layer is formed on the second electrode layer 37A and the second insulating layer 38, and a mask pattern (not shown) is formed on the conductive layer. Subsequently, the conductive layer is etched using the mask pattern as an etching barrier to form the column lines 39.

Figure 12A:
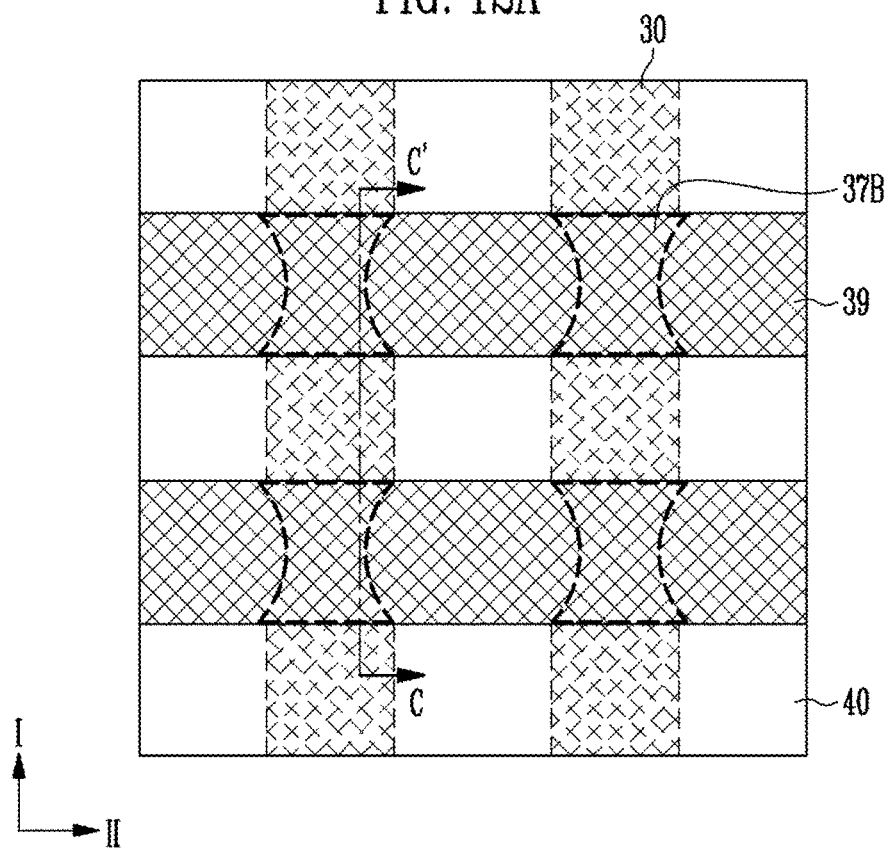
Figure 12B:
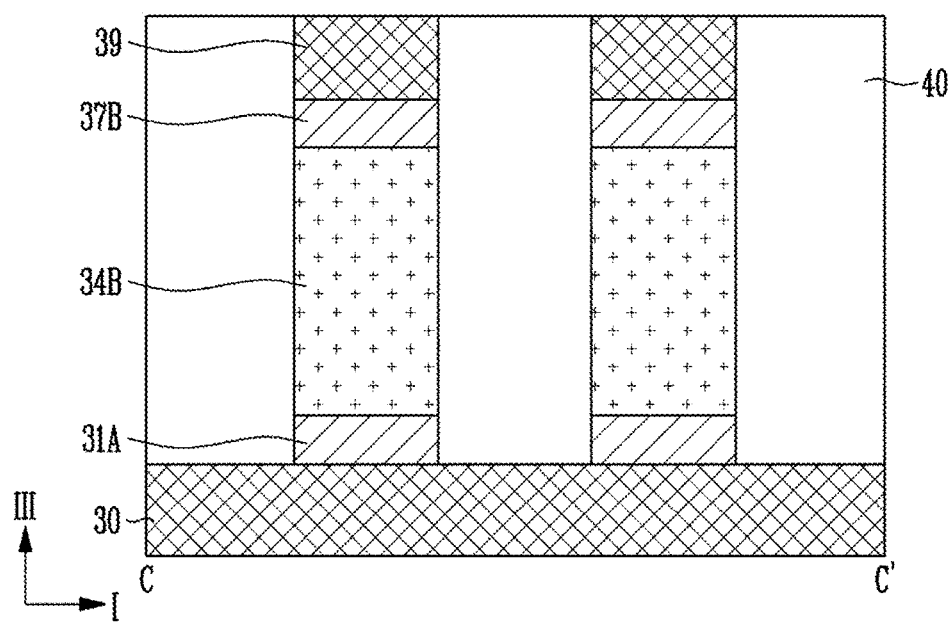

Referring to FIGS. 12A and 12B, the second electrode layer 37A is etched. FIG. 12B is a cross-sectional view along a line C-C' of FIG. 12A. For example, the second electrode layer 37A is etched using the column lines 39 and the mask pattern used in forming the column lines 39 as an etching barrier. At this time, the second electrode layer 37A may be etched under a condition that an etching ratio (or an etch rate selectivity) of the second electrode layer 37A over the column lines 39 and the mask pattern is relatively high. Therefore, second electrodes 37B positioned at respective intersection regions of the row lines 30 and the column lines 39 are formed.

Subsequently, the variable resistance layers 34A and the first electrode layers 31 are etched. Therefore, the variable resistance patterns 34B and the first electrodes 31A positioned at respective intersection regions of the row lines 30 and the column lines 39 are formed. Subsequently, a third insulating layer 40 is formed.

According to an embodiment of the present disclosure, the first insulating material 35 serves as a protective layer when the variable resistance material 34 is etched to form the variable resistance layer 34A, and the second insulating spacers 36 covers the sidewall SW of the first portion P1A of the variable resistance layer 34A. Moreover, the variable resistance layer 34A is not exposed when the second insulating layer 38 is planarized, for example, using a CMP process. As a result, damage to the variable resistance patterns 34B may be reduced compared to variable resistance elements in conventional memory cells, thereby improving characteristics of memory cells including the variable resistance patterns 34B compared to those of the conventional memory cells. In addition, the electrode material 37 is patterned to form the second electrode layer 37A having a line shape, and then the second electrode layer 37A is patterned to form the second electrodes 37B having an island shape. In contrast, when electrodes of the conventional memory cells may be formed using a spacer patterning technology (SPT) process to make a distance between adjacent electrodes relatively narrow. According to an embodiment of the present disclosure, after the electrode material 37 has been patterned by forming openings in an island shape or a line shape, the second electrodes 37B of a fine pattern may be formed without performing such a SPT process, thereby making the fabrication process of the memory cells including the second electrodes 37B relatively simple compared to that of the conventional memory cells.

Figure 13:
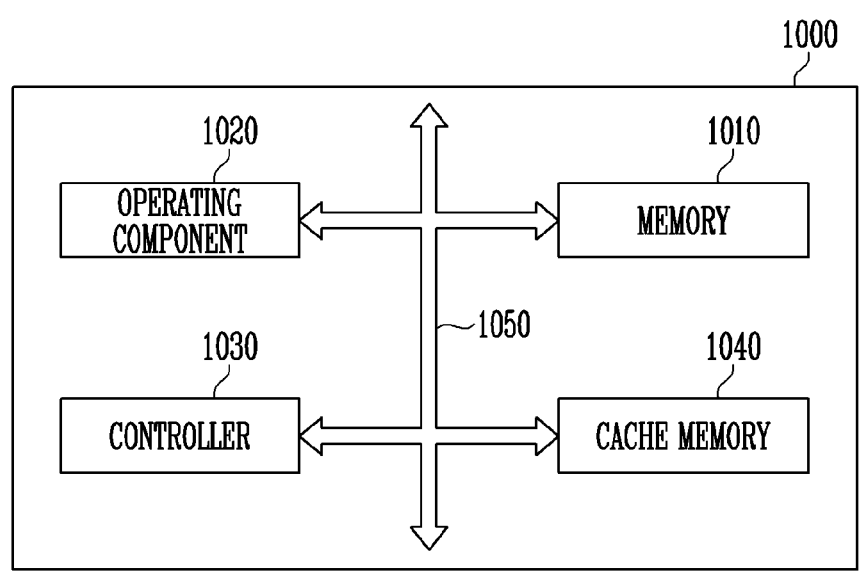
FIG. 13 is a configuration diagram of a microprocessor implementing a memory device according to an embodiment of the present disclosure.

FIG. 13 is a configuration diagram of a microprocessor implementing a memory device according to an embodiment of the present disclosure.

Referring to FIG. 13, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include a data register, an address register, a floating point register, and the like, and may further include various registers. The memory 1010 may temporarily store addresses at which data for performing an operation in the operating component 1020, data of a result of the performance, and data for the performance are stored.

The memory 1010 may include one or more embodiments of the semiconductor device described above. For example, the memory 1010 may include row lines, column lines intersecting the row lines, and memory cells including a variable resistance pattern positioned at an intersection region of the row lines and the column lines, having a cross section of an L shape, and having an upper surface which is rounded. Therefore, an operation characteristic of the memory 1010 may be improved. As a result, an operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from an external device such as the memory 1010, the operating component 1020, and the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 14:
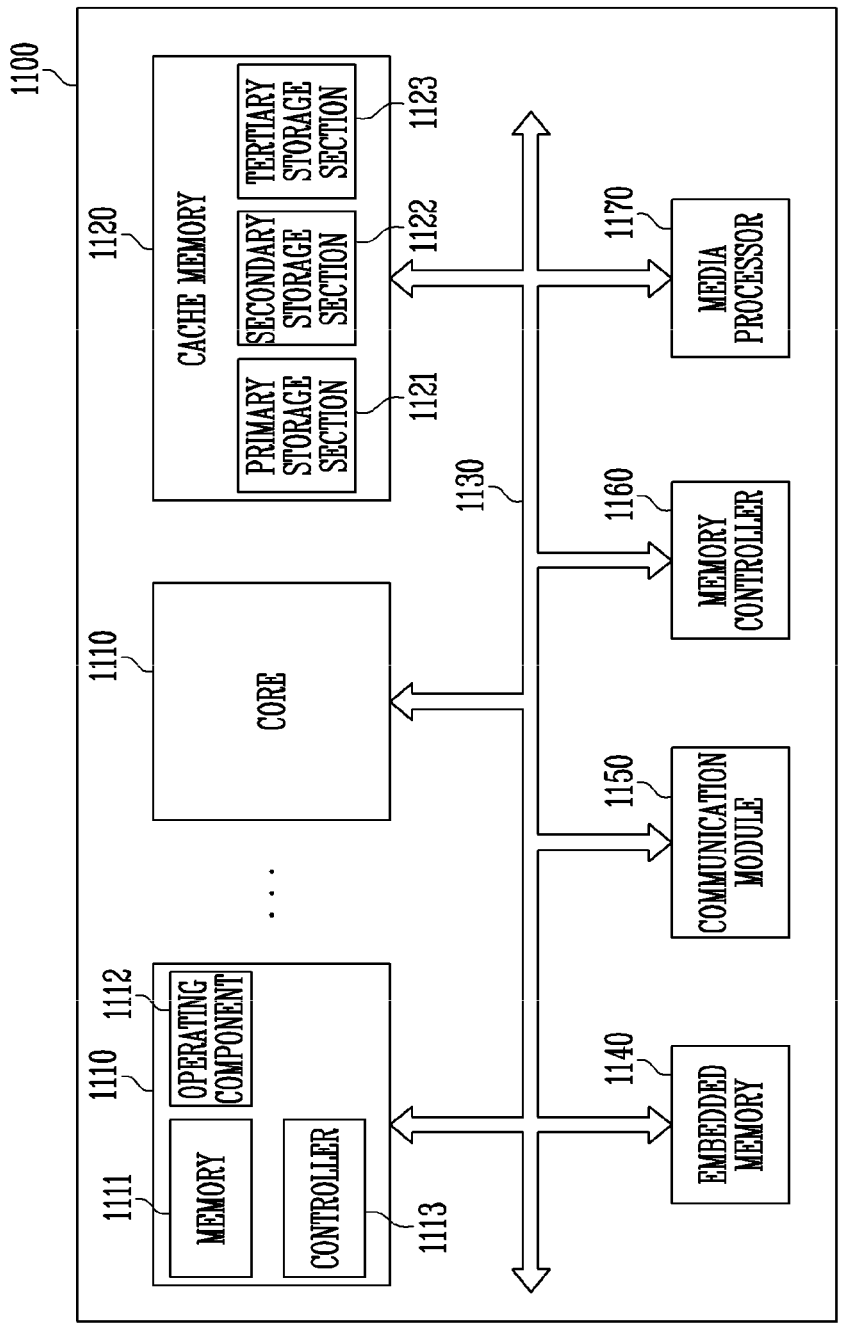
FIG. 14 is a configuration diagram of a processor implementing a memory device according to an embodiment of the present disclosure.

FIG. 14 is a configuration diagram of a processor implementing a memory device according to an embodiment of the present disclosure.

Referring to FIG. 14, the processor 1100 may include various functions in addition to the functions of a microprocessor for controlling and adjusting a series of processes of receiving data from various external devices, processing the data, and transmitting a result of the process to the external device, and thus performance improvement and multi-function may be implemented. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113.

The memory 1111 may be a processor register, a register, or the like, may store data in the processor 1100, may include a data register, an address register, a floating point register, and the like, and may further include various registers. The memory 1111 may temporarily store addresses at which data for performing an operation in the operating component 1112, data of a result of the performance, and data for the performance are stored. The operating component 1112 may be a part performing an operation in the processor 1100, and may perform various arithmetic operations, logical operations, and the like according to a result obtained by decoding an instruction by the controller 1113. The operating component 1112 may include one or more arithmetic and logic units (ALUs) and the like. The controller 1113 may receive a signal from an external device such as the memory 1111, the operating component 1112, and the processor 1100, perform extraction or decoding of an instruction, control of a signal input/output of the processor 1000, and the like, and execute a process indicated by a program.

The cache memory 1120 temporarily stores data to compensate for a data process speed difference between the core 1110 operating at a high speed and an external device operating at a low speed. The cache memory 1120 may include a primary storage 1121, a secondary storage 1122, and a tertiary storage 1123. In general, the cache memory 1120 includes the primary storage 1121 and the secondary storage 1122, and may include the tertiary storage 1123 when a high capacity is required. The cache memory 1120 may include more storages as needed. That is, the number of storages included in the cache memory 1120 may vary depending on design. Here, process speeds for storing and discriminating data in the primary, secondary, and tertiary storages 1121, 1122, and 1123 may be the same or different. When the process speeds of each storage are different, the speed of the primary storage may be the fastest. One or more of the primary storage 1121, the secondary storage 1122, and the tertiary storage 1123 of the cache memory 1120 may include one or more embodiments of the semiconductor device described above. For example, the cache memory 1120 may include row lines, column lines intersecting the row lines, and memory cells including a variable resistance pattern positioned at an intersection region of the row lines and the column lines, having a cross section of an L shape, and having an upper surface which is rounded.

FIG. 14 shows a case where all of the primary, secondary, and tertiary storages 1121, 1122, and 1123 are configured in the cache memory 1120. However, all of the primary, secondary, and tertiary storages 1121, 1122, and 1123 may be configured outside the core 1110 and compensate for the process speed difference between the core 1110 and the external device. Alternatively, the primary storage 1121 of the cache memory 1120 may be positioned inside the core 1110, and the secondary storage 1122 and the tertiary storage 1123 may be configured outside the core 1110 and thus a function of compensating the process speed difference may be further strengthened. Alternatively, the primary and secondary storages 1121 and 1122 may be positioned inside the core 1110, and the tertiary storage 1123 may be positioned outside the core 1110.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured equally to the core described above. When the processor 1100 includes the plurality of cores 1110, the primary storage 1121 of the cache memory 1120 may be configured in the respective cores 1110 corresponding to the number of the plurality of cores 1110, and the secondary storage 1122 and the tertiary storage 1123 may be configured outside the plurality of cores 1110 to be shared through the bus interface 1130. Here, the process speed of the primary storage 1121 may be faster than the process speeds of the secondary and tertiary storages 1122 and 1123. In another embodiment, the primary storage 1121 and the secondary storage 1122 may be configured in the respective cores 1110 corresponding to the number of the plurality of cores 1110, and the tertiary storage 1123 may be configured outside the plurality of cores 1110 to be shared through the bus interface 1130.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 15:
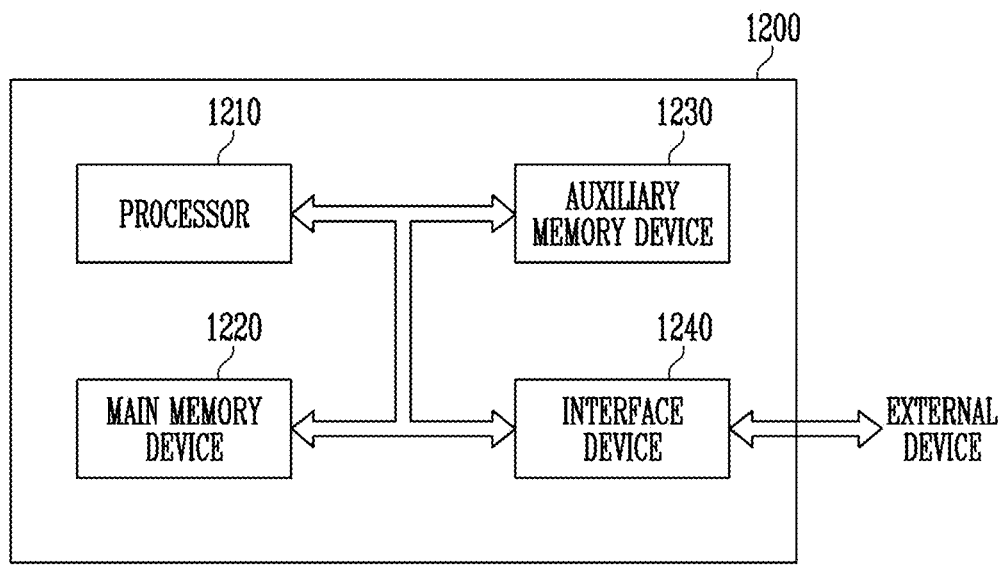
FIG. 15 is a configuration diagram of a system implementing a memory device according to an embodiment of the present disclosure.

FIG. 15 is a configuration diagram of a system implementing a memory device according to an embodiment of the present disclosure.

Referring to FIG. 15, a system 1200 is a device that processes data, and may perform input, process, output, communication, storage, and the like in order to perform a series of operations on data. The system 1200 may include a processor 1210, a main storage device 1220, an auxiliary storage device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200. The processor 1210 may include a microprocessor unit (MPU), a central processing unit (CPU), a single/multi core processor, a graphic processing unit (GPU), an application processor (AP), a digital signal processor (DSP), and the like.

The main storage device 1220 is a storage space capable of moving, storing, and executing a program code or data from the auxiliary storage 1230 when the program is executed. A stored content may be preserved even though power is shut off. The main storage device 1220 may include one or more embodiments of the semiconductor device described above. For example, the main storage device 1220 may include row lines, column lines intersecting the row lines, and memory cells including a variable resistance pattern positioned at an intersection region of the row lines and the column lines, having a cross section of an L shape, and having an upper surface which is rounded. As a result, an operation characteristic of the system 1200 may be improved.

In addition, the main storage device 1220 may further include a static random access memory (SRAM), a dynamic random access memory (DRAM), or the like of a volatile memory type in which all contents are erased when power is turned off. Alternatively, the main storage device 1220 may not include the semiconductor device of the embodiment described above and may further include a static random access memory (SRAM), a dynamic random access memory (DRAM), or the like of a volatile memory type in which all contents are erased when power is turned off.

The auxiliary storage device 1230 refers to a storage device for storing a program code or data. The auxiliary storage device 1230 is slower than the main storage device 1220 but may store a lot of data. The auxiliary storage device 1230 may include one or more embodiments of the semiconductor device described above. For example, the auxiliary storage device 1230 may include row lines, column lines intersecting the row lines, and memory cells including a variable resistance pattern positioned at an intersection region of the row lines and the column lines, having a cross section of an L shape, and having an upper surface which is rounded. As a result, an operation characteristic of the system 1200 may be improved.

In addition, the auxiliary storage device 1230 may further include a data storage system (refer to 1300 of FIG. 16) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card. Alternatively, the auxiliary storage device 1230 may not include the semiconductor device of the embodiment described above and may include data storage systems (refer to 1300 of FIG. 16) such as a magnetic tape using magnetism, a magnetic disk, a laser disk using light, a magneto-optical disk using the magnetism and light, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

Figure 16:
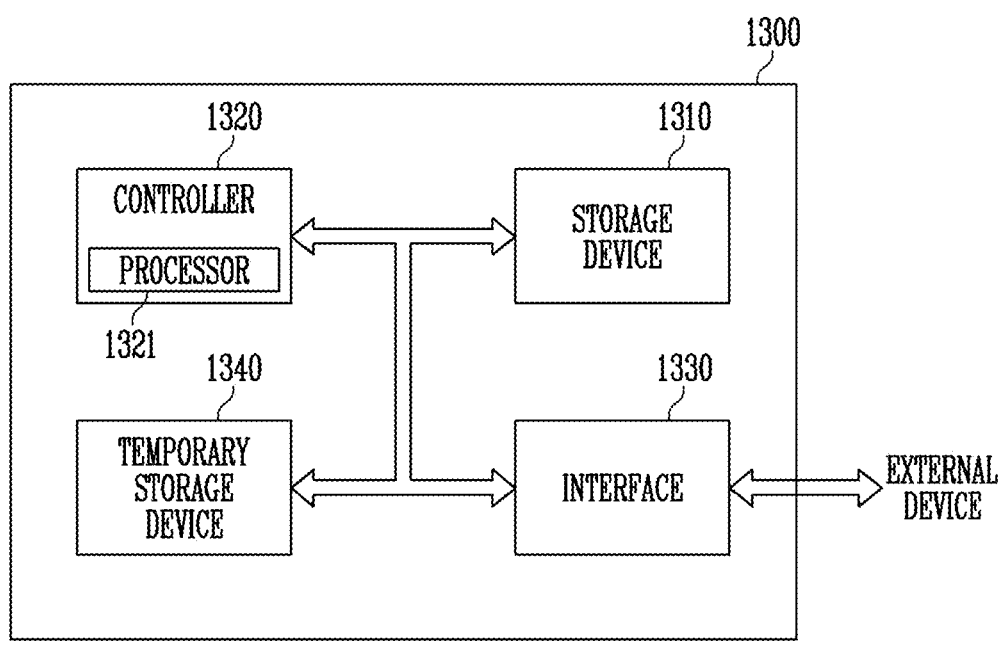
FIG. 16 is a configuration diagram of a data storage system implementing a memory device according to an embodiment of the present disclosure.

FIG. 16 is a configuration diagram of a data storage system implementing a memory device according to an embodiment of the present disclosure.

Referring to FIG. 16, the data storage system 1300 may include a storage device 1310 having a non-volatile characteristic as a configuration for storing data, a controller 1320 that controls the storage device 1310, an interface 1330 for connection with an external device, and a temporary storage device 1340 for temporarily storing data. The data storage system 1300 may be a disk type such as a hard disk drive (HDD), a compact disk read only memory (CDROM), a digital versatile disk (DVD), and a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The storage device 1310 may include a non-volatile memory that semi-permanently stores data. Here, the non-volatile memory may include a read only memory (ROM), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 that performs an operation or the like for processing commands input through the interface 1330 from the outside of the data storage system 1300.

The interface 1330 is for exchanging an instruction, data, and the like between the data storage system 1300 and an external device. When the data storage system 1300 is a card type, the interface 1330 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. When the data storage system 1300 is a disk type, the interface 1330 may be compatible with an interface such as integrated device electronics (IDE), serial advanced technology attachment (SATA), a small computer system interface (SCSI), external SATA (eSATA), personal computer memory card international association (PCM-CIA), and a universal serial bus (USB), or may be compatible with an interface similar to these interfaces. The interface 1330 may be compatible with one or more interfaces having different types.

The temporary storage device 1340 may temporarily store data in order to efficiently transfer data between the interface 1330 and the storage device 1310 according to diversification and high performance of the interface with the external device, the controller, and the system. The temporary storage device 1340 may include one or more embodiments of the semiconductor device described above. For example, the temporary storage device 1340 may include row lines, column lines intersecting the row lines, and memory cells including a variable resistance pattern positioned at an intersection region of the row lines and the column lines, having a cross section of an L shape, and having an upper surface which is rounded. As a result, an operation characteristic of the system 1200 may be improved. Therefore, an operation characteristic of the temporary storage device 1340 may be improved. As a result, an operation characteristic of the data storage system 1300 may be improved.

Figure 17:
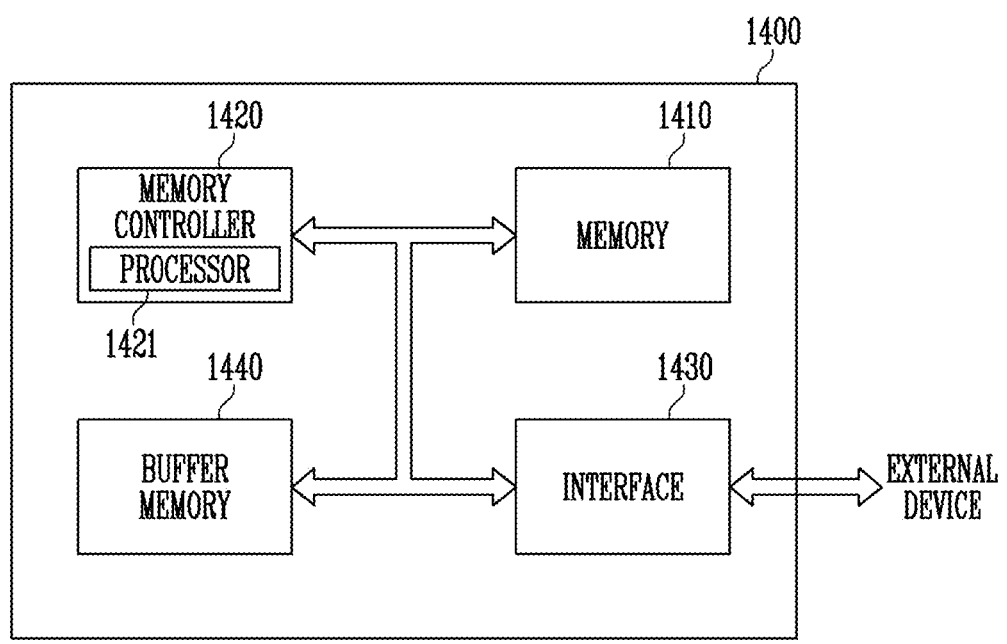
FIG. 17 is a configuration diagram of a memory system implementing a memory device according to an embodiment of the present disclosure.

FIG. 17 is a configuration diagram of a memory system implementing a memory device according to an embodiment of the present disclosure.

Referring to FIG. 17, the memory system 1400 may include a memory 1410 having a non-volatile characteristic as a configuration for storing data, a memory controller 1420 that controls the memory 1410, an interface 1430 for connection with an external device, and the like. The memory system 1400 may be a disk type such as a solid state drive (SSD) and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1410 that stores data may include one or more embodiments of the semiconductor device described above. For example, the memory 1410 may include row lines, column lines intersecting the row lines, and memory cells including a variable resistance pattern positioned at an intersection region of the row lines and the column lines, having a cross section of an L shape, and having an upper surface which is rounded. Therefore, an operation characteristic of the memory 1410 may be improved. As a result, an operation characteristic of the memory system 1400 may be improved.

In addition, the memory of the present embodiment may include a read only memory (ROM), a NOR flash memory, a NAND flash memory, a phase change random access memory (PRAM), a resistive access memory (RRAM), a magnetic random access memory (MRAM), and the like having a non-volatile characteristic.

The memory controller 1420 may control exchange of data between the memory 1410 and the interface 1430. To this end, the memory controller 1420 may include a processor 1421 for processing and operating commands input through the interface 1430 from the outside of the memory system 1400.

The interface 1430 is for exchanging an instruction, data, and the like between the memory system 1400 and an external device. The interface 1430 may be compatible with an interface used in a device such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card, or may be compatible with an interface used in a device similar to these devices. The interface 1430 may be compatible with one or more interfaces having different types.

The memory system 1400 of the present embodiment may further include a buffer memory 1440 for efficiently transferring input/output of data between the interface 1430 and the memory 1410 according to diversification and high performance of the interface with the external device, the memory controller, and the memory system. The buffer memory 1440 that temporarily stores data may include one or more embodiments of the semiconductor device described above. For example, the buffer memory 1440 may include row lines, column lines intersecting the row lines, and memory cells including a variable resistance pattern positioned at an intersection region of the row lines and the column lines, having a cross section of an L shape, and having an upper surface which is rounded. As a result, an operation characteristic of the memory system 1400 may be improved.

In addition, the buffer memory 1440 of the present embodiment may further include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like. Alternatively, the buffer memory 1440 may not include the semiconductor device of the embodiment described above, and may include a static random access memory (SRAM) and a dynamic random access memory (DRAM) having a volatile characteristic, a read only memory (ROM), a NOR flash memory, a NAND flash memory, a phase change random access memory (PRAM), a resistive random access memory (RRAM), a spin transfer torque random access memory (STTRAM), and a magnetic random access memory (MRAM) having a non-volatile characteristic, and the like.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

What is claimed is:

1. An electronic device including a semiconductor memory, wherein the semiconductor memory comprises:
   a plurality of row lines;
   a plurality of column lines intersecting the row lines; and
   a plurality of memory cells disposed at respective intersections of the row lines and the column lines, each memory cell including a variable resistance pattern having an upper surface which is rounded,
   wherein each of the plurality of memory cells is programmed by performing a program operation to store logic states having different threshold voltages in each of the plurality of memory cells, and
   wherein the variable resistance pattern functions as a memory material and a selection material during the program operation and maintains an amorphous state before and after the programming operation.

2. The electronic device of claim 1, further comprising:
   a first insulating spacer disposed over the variable resistance pattern of each of the memory cells and having an upper surface which is rounded.

3. The electronic device of claim 2, wherein the first insulating spacer includes a first sidewall that is in contact with the variable resistance pattern and a second sidewall facing the first sidewall, the variable resistance pattern includes a first portion and a second portion protruding from the first portion, and the second sidewall is substantially aligned with a sidewall of the first portion.

4. The electronic device of claim 2, further comprising:
a second insulating spacer disposed over the first insulating spacer and having an upper surface which is rounded.

5. The electronic device of claim 4, wherein a lower surface of the second insulating spacer is positioned at a level lower than that of a lower surface of the first insulating spacer.

6. The electronic device of claim 2, wherein a top of the first insulating spacer is lower than a top of the variable resistance pattern so that a portion of the rounded upper surface of the variable resistance pattern is covered by the first insulating spacer and a remaining portion of the rounded upper surface of the variable resistance pattern is exposed by the first insulating spacer.

7. The electronic device of claim 1, wherein each of the memory cells comprises:
a first electrode interposed between each of the row lines and the variable resistance pattern; and
a second electrode interposed between each of the column lines and the variable resistance pattern.

8. The electronic device of claim 7, wherein the variable resistance pattern comprises:
a first portion disposed over the first electrode; and
a second portion protruding from the first portion and coupled to the second electrode.

9. The electronic device of claim 8, wherein the first portion has a width wider than a width of the second portion.

10. The electronic device of claim 1, wherein the variable resistance pattern includes a chalcogenide.

11. The electronic device of claim 7, wherein the variable resistance pattern comprises:
a first portion disposed over the first electrode; and
a second portion including a curved upper portion and a vertical lower portion, the vertical lower portion being disposed between the first portion and the curved upper portion.

12. The electronic device of claim 11, wherein the curved upper portion of the variable resistance pattern is a first curved upper portion, the device further comprising:
a first insulating spacer disposed over a sidewall of the second portion of the variable resistance pattern and including a second curved upper portion, an uppermost level of the second curved upper portion being lower than an uppermost level of the first curved upper portion.

13. The electronic device of claim 12, further comprising:
a second insulating spacer disposed over the first insulating spacer and a sidewall of the first portion of the variable resistance pattern.

14. The electronic device of claim 1, wherein the variable resistance pattern includes a tip defined by the rounded upper surface and a sidewall.

15. An electronic device including a semiconductor memory, wherein the semiconductor memory comprises:

a plurality of row lines;
a plurality of column lines intersecting the row lines;
a plurality of memory cells disposed at respective intersections of the row lines and the column lines, each memory cell including a variable resistance pattern having an upper surface which is rounded and a cross-section of an L shape,
a first insulating spacer disposed over the variable resistance pattern of each of the memory cells; and
a second insulating spacer disposed over the first insulating spacer,
wherein a lowermost surface of the second insulating spacer is coplanar with a lowermost surface of the variable resistance pattern.

16. An electronic device including a semiconductor memory, wherein the semiconductor memory comprises:
a plurality of row lines;
a plurality of column lines intersecting the row lines;
a plurality of memory cells disposed at respective intersections of the row lines and the column lines, each memory cell including a variable resistance pattern having a cross-section of an L shape and a rounded upper surface, the variable resistance pattern including a chalcogenide; and
a first insulating spacer disposed over the variable resistance pattern of each of the memory cells,
wherein a top of the first insulating spacer is lower than a top of the variable resistance pattern so that a portion of the rounded upper surface of the variable resistance pattern is covered by the first insulating spacer and a remaining portion of the rounded upper surface of the variable resistance pattern is exposed by the first insulating spacer.

17. The electronic device of claim 16, wherein the first insulating spacer has an upper surface which is rounded.

18. The electronic device of claim 17, further comprising:
a second insulating spacer disposed over the first insulating spacer and having an upper surface which is rounded.

19. The electronic device of claim 16, wherein the variable resistance pattern comprises:
a first portion disposed over a first electrode; and
a second portion including a curved upper portion and a vertical lower portion, the vertical lower portion being disposed between the first portion and the curved upper portion,
wherein the curved upper portion of the variable resistance pattern is a first curved upper portion, and
wherein the first insulating spacer is disposed over a sidewall of the second portion of the variable resistance pattern and including a second curved upper portion.

20. The electronic device of claim 16, wherein the chalcogenide material functions as a memory material and a selection material during a program operation and maintains an amorphous state before and after the programming operation.

* * * * *